US007432135B2

(12) United States Patent
Takahashi

(10) Patent No.: US 7,432,135 B2
(45) Date of Patent: Oct. 7, 2008

(54) SEMICONDUCTOR DEVICE AND METHOD OF MANUFACTURING THE SAME

(75) Inventor: Hideki Takahashi, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 259 days.

(21) Appl. No.: 11/463,502

(22) Filed: Aug. 9, 2006

(65) Prior Publication Data

US 2007/0108468 A1 May 17, 2007

(30) Foreign Application Priority Data

Nov. 14, 2005 (JP) ............................ 2005-328541

(51) Int. Cl.
*H01L 21/332* (2006.01)
*H01L 29/74* (2006.01)
*H01L 29/78* (2006.01)

(52) U.S. Cl. ........................ 438/140; 257/133; 257/139

(58) Field of Classification Search ......... 438/135-140, 438/268; 257/133-139
See application file for complete search history.

(56) References Cited

U.S. PATENT DOCUMENTS 6,153,896 A * 11/2000 Omura et al. ............... 257/139
6,566,691 B1 * 5/2003 Inoue et al. ................. 257/139
6,781,199 B2 8/2004 Takahashi ................... 257/330
6,809,349 B2 * 10/2004 Yamaguchi et al. ......... 257/133
2005/0017290 A1 1/2005 Takahashi et al. ........... 257/328
2005/0045960 A1 3/2005 Takahashi ................... 257/368

* cited by examiner

*Primary Examiner*—Calvin Lee
(74) *Attorney, Agent, or Firm*—Oblon, Spivak, McClelland, Maier & Neustadt, P.C.

(57) ABSTRACT

A semiconductor device, including: a semiconductor substrate of a first conductivity type having a first and second major surfaces; a first conductivity type semiconductor layer formed on the first major surface of the semiconductor substrate; a base layer of a second conductivity type formed on the first major surface of the semiconductor layer and separated by the semiconductor layer from the semiconductor substrate; a pair of groove portions penetrating the base layer from the first major surface and reaching at least the semiconductor layer; an insulation film disposed inside the groove portion and a gate electrode formed inside the groove portion through the insulation film; a first conductivity type semiconductor layer and a second conductivity type semiconductor layer formed on the second major surface of the semiconductor substrate; and an emitter region disposed on the first major surface of the base layer and along the groove portions, wherein a transistor controlling a current flowing in the base layer by the gate electrode and a diode made of the semiconductor layer and the base layer are disposed within the semiconductor device, and the emitter region is disposed only in an area which is between the pair of groove portions.

14 Claims, 25 Drawing Sheets

He IMPLANTATION

SEMICONDUCTOR DEVICE AND METHOD OF MANUFACTURING THE SAME

CROSS-REFERENCE TO RELATED APPLICATION

The disclosure of Japanese Patent Application No. 2005-328541 filed on Nov. 14, 2005 including specification, drawings and claims is incorporated herein by reference in its entirety.

BACKGROUND OF THE INVENTION

1. Field of the Invention

The present invention is related to a power semiconductor device and a method of manufacturing the same, and more particularly, to a semiconductor device which includes an insulating gate bipolar transistor and a free wheel diode and a method of manufacturing the same.

2. Description of the Related Art

FIG. 33 is a circuitry diagram of an inverter which uses an insulating gate bipolar transistor (hereinafter referred to as an "IGBT") and a free wheel diode (hereinafter referred to simply as a "diode"). An inverter which is a converter to convert from DC to AC and vice versa is formed by an IGBT, which is a switching element, and a diode. Four or six IGBT/diode elements are used as one set (six elements in FIG. 33) for control of a motor.

A DC terminal of the inverter shown in FIG. 33 is connected with a DC power source, and switching of the IGBTs converts a DC voltage into an AC voltage which is then fed to a motor which is a load. In this inverter, the diodes are connected in a reverse parallel arrangement with the IGBTs so that the diodes and the IGBTs are respectively paired.

FIG. 34 is a cross sectional view of a semiconductor device generally denoted at 1000 in which an IGBT and a diode are incorporated within one element, which is a structure containing the IGBTs and the diodes (JP, 2005-57235, A).

The semiconductor device 1000 includes an N− substrate 1. On the N− substrate 1, a P base layer 2 is selectively formed through an N layer 4. Emitter regions 3 containing a high concentration of n-type impurities are selectively formed on the P base layer 2.

There are grooves 7 which extend from the emitter regions 3 to the N− substrate 1. Gate insulation films 8 are formed on the inner walls of the grooves 7, and gate electrodes 9 of poly-silicon are disposed further inside. The P base layer 2 located between the emitter regions 3 and the N layer 4 serves as a channel region.

Inter-layer insulation films 10 are disposed on the emitter regions 3. An emitter electrode 11 is formed so that it contacts parts of the emitter regions 3 and the P base layer 2.

The back surface of the N− substrate 1 seats an N+ cathode layer 5 and a P+ collector layer 6, and a collector electrode 13 is formed on the back surfaces of the N+ cathode layer 5 and the P+ collector layer 6.

An operation of the IGBT 1000 is basically the same as that of an ordinary IGBT. There is however the N layer 4 disposed, and therefore, while the IGBT is ON, the N layer 4 serves as a barrier against holes implanted from the P+ collector layer 6, which makes it difficult for the holes to move to the P base layer 2. This accumulates carriers near the N layer 4 and lowers the ON-voltage of the IGBT 1000. When the IGBT is OFF, the N layer 4 gets depleted at a collector voltage and the influence of the N layer 4 disappears.

There nevertheless is a problem with the semiconductor device 1000 that since the semiconductor device 1000 internally includes the diodes, VF (forward-direction breakdown voltage) of the diodes increases when the gates of the IGBTs turn on.

There is another problem that when helium ions (lifetime killer) are implanted into the N layer 4 in an attempt to shorten the lifetime of carriers inside the N layer 4 and reduce a recovery current (denoted at Irr in FIG. 35), a VF increase at the diodes caused by turning on of the gates of the IGBTs becomes greater than a VF increase as it is in the OFF-state.

SUMMARY OF THE INVENTION

Accordingly, an object of the present invention is to provide a semiconductor device which includes IGBTs and diodes and which reduces a recovery current without increasing VF of the diodes.

The present invention is directed to a semiconductor device, including: a semiconductor substrate of a first conductivity type having a first and second major surfaces; a first conductivity type semiconductor layer formed on the first major surface of the semiconductor substrate; a base layer of a second conductivity type formed on the first major surface of the semiconductor layer and separated by the semiconductor layer from the semiconductor substrate; a pair of groove portions penetrating the base layer from the first major surface and reaching at least the semiconductor layer; an insulation film disposed inside the groove portion and a gate electrode formed inside the groove portion through the insulation film; a first conductivity type semiconductor layer and a second conductivity type semiconductor layer formed on the second major surface of the semiconductor substrate; and an emitter region disposed on the first major surface of the base layer and along the groove portions, wherein a transistor controlling a current flowing in the base layer by the gate electrode and a diode made of the semiconductor layer and the base layer are disposed within the semiconductor device, and the emitter region is disposed only in an area which is between the pair of groove portions.

The present invention is directed also to a method of manufacturing a semiconductor device having a transistor controlling a current flowing in a base layer by a gate electrode and a diode, including the steps of: preparing a semiconductor substrate of a first conductivity type having first and second major surfaces; forming a first conductivity type semiconductor layer on the first major surface of the semiconductor substrate; forming a base layer of a second conductivity type on the surface of the semiconductor layer; forming a pair of groove portions penetrating the base layer from the first major surface and reaching at least the semiconductor layer; disposing an insulation film inside the groove portions and forming a gate electrode inside the groove portions through the insulation film; forming a first conductivity type semiconductor layer and a second conductivity type semiconductor layer on the second major surface of the semiconductor substrate; and disposing an emitter region along the groove portions only in a section of the base layer on the first major surface and located between the pair of groove portions.

As described above, in the semiconductor device according to the present invention, VF of a diode does not increase even when an IGBT is ON, and a recovery current as well is reduced.

DETAILED DESCRIPTION OF THE PREFERRED EMBODIMENTS

Figure 34:
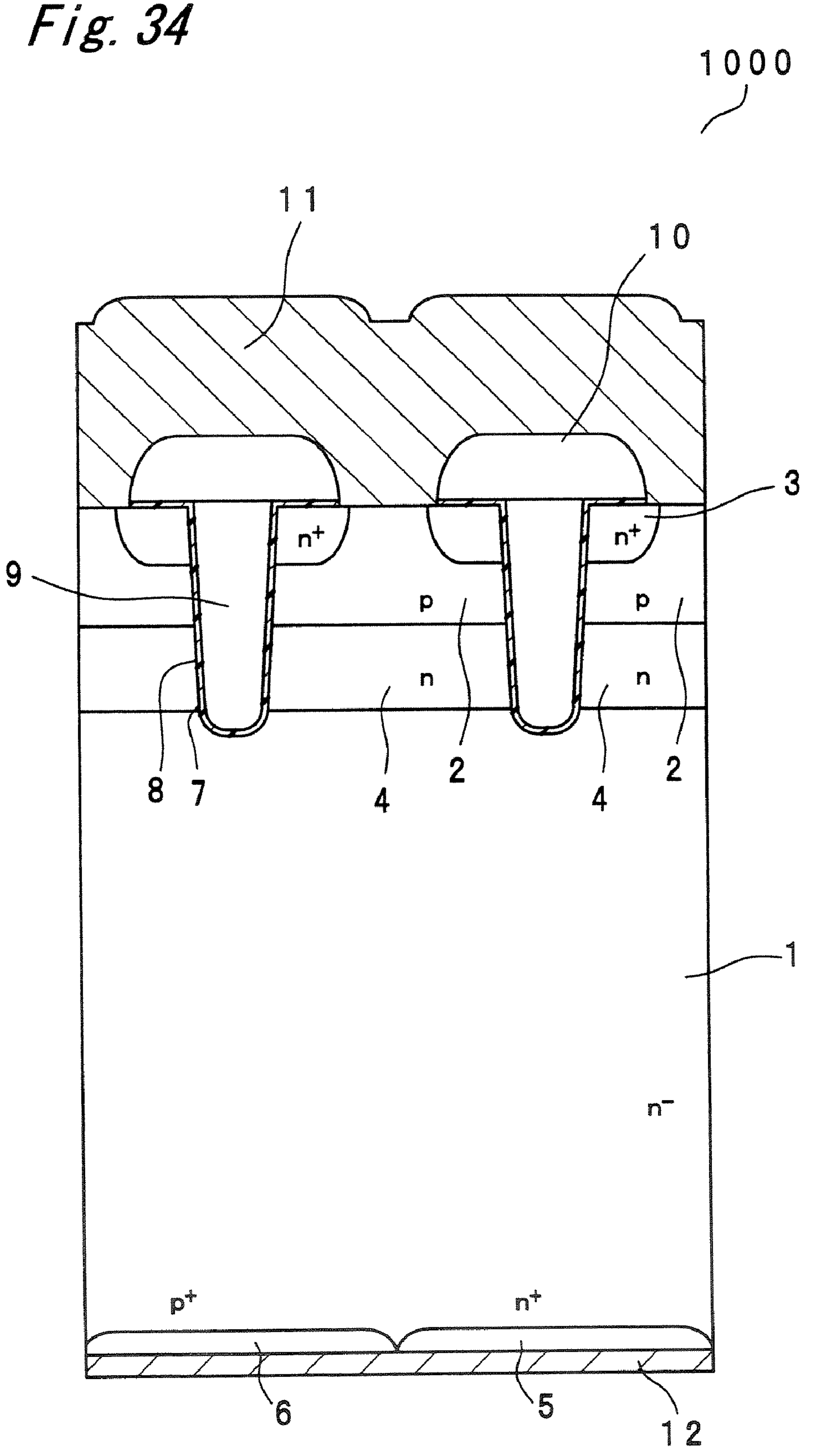
FIG. 34 is a cross sectional view of a conventional semiconductor device.
Figure 35:
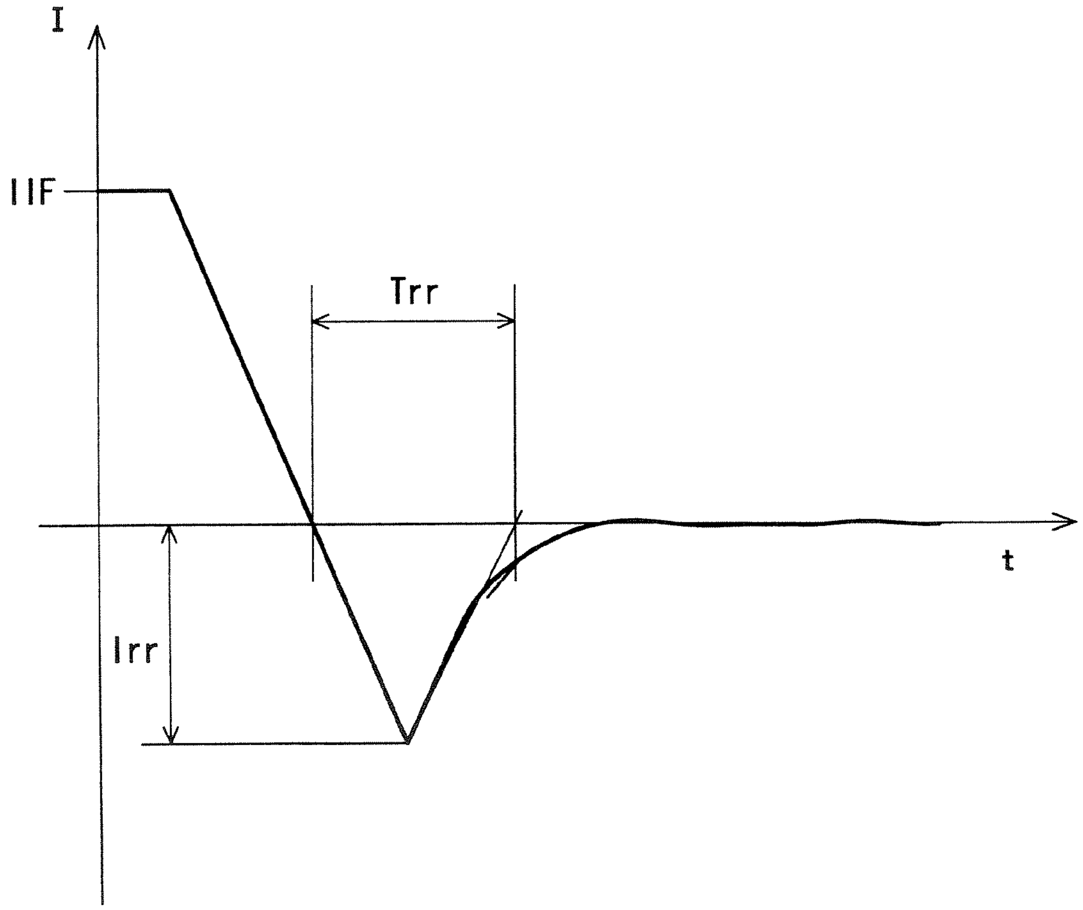
FIG. 35 shows the waveform of a current during reverse recovery as it is when a diode changes from the OFF-state to the ON-state.

A description will now be given on how VF (forward-direction breakdown voltage) of a diode increases when the gate of an IGBT turns on within a semiconductor device 1000 (FIG. 34).

The diode turns on when a potential between a P base layer 2 and an N layer 4 exceeds a built-in potential at a PN junction. However, as the gate of the IGBT turns on, the N layer 4 and emitter regions (N+ layer) 3 become conductive. Since the emitter regions 3 have a common contact with the P base layer 2, turning on of the gate makes it difficult to apply a voltage upon the PN junction between the P base layer 2 and the N layer 4. It is therefore considered that implantation of holes does not easily occur in the vicinity of the P base layer 2 and VF accordingly increases.

It is further considered that since irradiation of helium ions as a lifetime killer shortens the lifetime near the P base layer 2, as holes implanted in a reduced amount are further combined with the lifetime killer in this region as described above, VF significantly increases.

Figure 36:
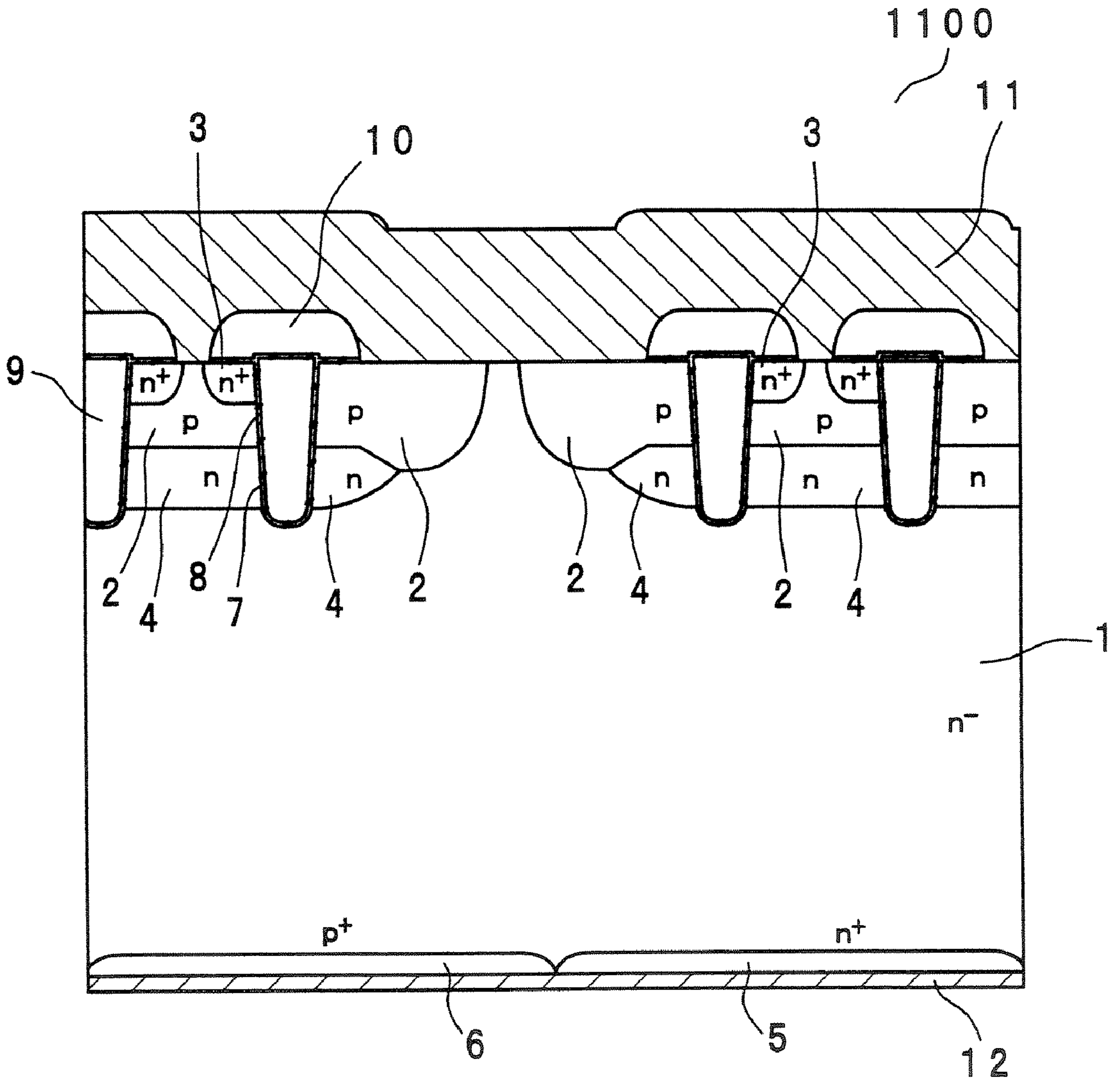
FIG. 36 is a cross sectional view of a semiconductor device fabricated as a trial.

In light of these considerations, for reduction of a recovery current in a diode and a suppressed increase of VF of the diode during turning on of the gate of an IGBT, the inventor proposed a semiconductor device 1100 as that shown in FIG. 36 (JP, 2005-101514, A). In the semiconductor device 1100, (two) pairs of grooves 7 are formed extending from the surface (In FIG. 36, there are two pairs of grooves 7.). One pair of grooves 7 extends approximately parallel to the direction which is perpendicular to the plane of the drawing.

There are the N layer 4, the P base layer 2 and the emitter regions 3 between the paired grooves 7, thereby forming an IGBT. In an area outside the paired grooves 7 where there is no emitter region 3, a side diffusion region of the P base layer 2 and an MPS diode (Merged PiN Diode and Schottky Barrier Diode) are formed.

As the area of the IGBT and that of the diode are partitioned by the grooves 7, it is possible to suppress VF of the diode from increasing during turning on of the gate of the IGBT. Further, as the diode area is an MPS, it is possible to suppress a recovery current.

This however gives rise to a problem that the ON-voltage of the IGBT increases as holes implemented from the back surface while the IGBT operates move through the MPS area and to the emitter electrode 11.

There is a further problem that as the diode is an MPS, the area where the diode is formed is large, the width of the area located between the paired grooves 7 where the emitter regions 3 are formed is narrow, and therefore it is not possible to sufficiently suppress a VF increase of the diode during turning on of the gate of the IGBT.

This leads to another problem that the gaps between the first grooves 7 and a second groove 7 can not be enough despite an effort to suppress a decrease of the breakdown voltage by means of the second groove formed outside the groove (first groove) 7 where no emitter region 3 is formed, and it is not therefore possible to sufficiently suppress a VF increase.

From the findings, the inventor has proposed semiconductor devices according to the following embodiments.

Embodiment 1

Figure 1:
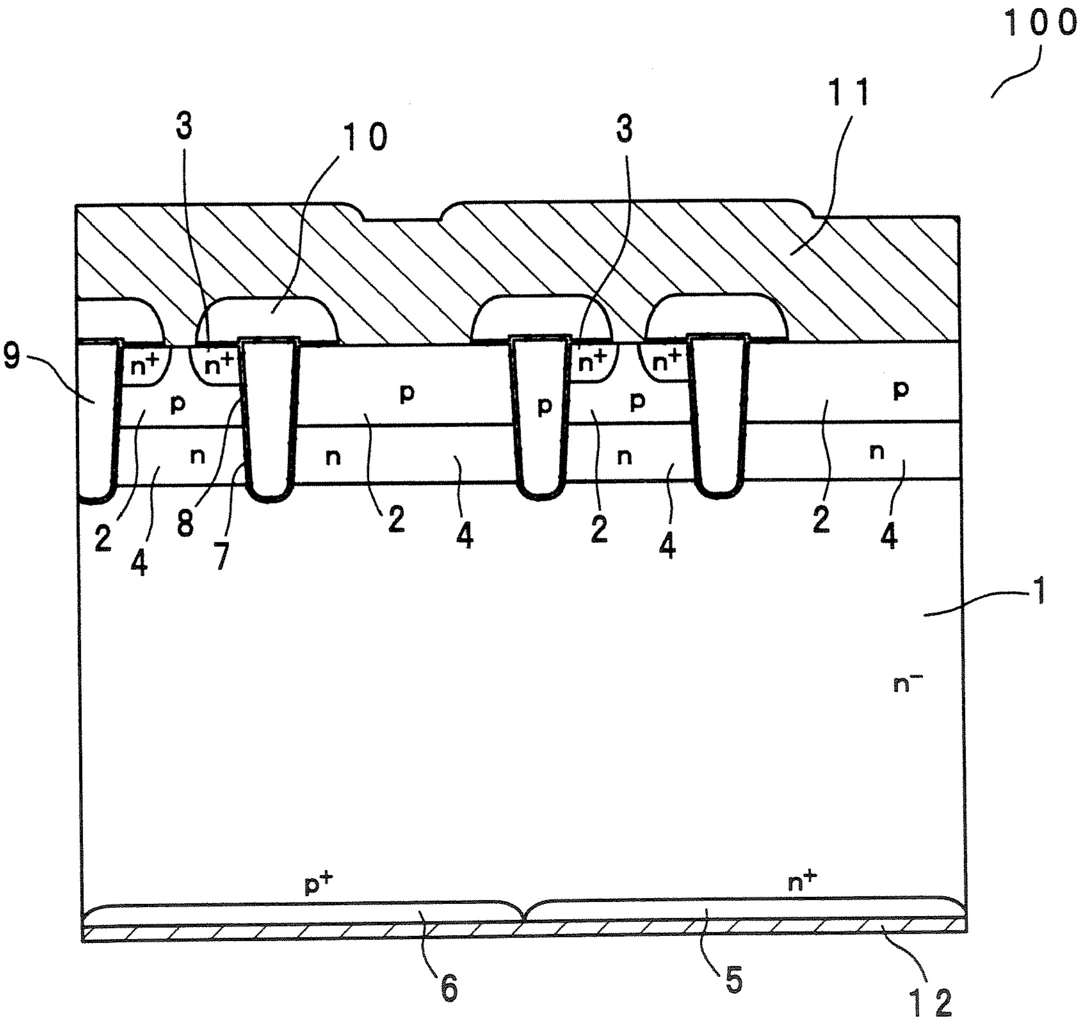
FIG. 1 is a cross sectional view of a semiconductor device according to an embodiment 1 of the present invention.

FIG. 1 is a cross sectional view of a semiconductor device generally denoted at 100 according to the embodiment 1 of the present invention.

The semiconductor device 100 includes an N− substrate 1 of silicon for example. On the N− substrate 1, an N layer 4 and a P base layer 2 are formed each by diffusion.

There are paired grooves (One set includes two.) 7 which extend from the surface of the P base layer 2 and reach the N− substrate 1. The paired grooves 7 extend approximately parallel to the direction which is perpendicular to the plane of FIG. 1. Within the P base layer 2 between the paired grooves 7, there are emitter regions 3 which are obtained by selectively diffusing a high concentration of n-type impurities.

In the semiconductor device 100, the width of the area without any emitter region 3 located between the paired adjacent grooves 7 is wider than the width between the paired grooves 7.

Gate oxide films 8 of oxide silicon for example are formed on the inner walls of the grooves 7. Further, gate electrodes 9 of poly-silicon for example are disposed inside the gate oxide films 8. The P base layer 2 which contacts the gate electrodes 9 through the gate oxide films 8 serves as a channel region of an IGBT.

On the gate electrodes 9, inter-layer insulation films 10 of oxide silicon for example are disposed, partially covering the emitter regions 3. There is an emitter electrode 11 of aluminum for instance is disposed partially on the emitter regions 3 and on the P base layer 2.

A P+ collector layer 6 and an N+ cathode layer 5 are formed separately on the back surface of the N− substrate 1. Further, there is a collector electrode 12 which is connected with both the P+ collector layer 6 and the N+ cathode layer 5.

An operation of the semiconductor device 100 will now be described.

A predetermined collector voltage $V_{CE}$ is applied between the emitter electrode 11 and the collector electrode 12 in the semiconductor device 100 which is shown in FIG. 1. As a predetermined gate voltage $V_{GE}$ is applied between the emitter electrode 11 and the gate electrodes 9 in this condition, the P base layer 2 changes to the N-type and a channel is created. Through this channel, electrons are implanted into the N− substrate 1 from the emitter electrode 11. Thus implanted electrons apply a forward bias between the P+ collector layer 6 and the N− substrate 1, and holes are implanted into the N− substrate 1 from the P+ collector layer 6. This greatly reduces the resistance of the N− substrate 1 but increases the current capacity of the IGBT.

At this stage, the area located between the paired grooves 7 operates as the IGBT. On the contrary, the area between the grooves 7 where no emitter region 3 is formed does not operate as the IGBT. The N layer 4 is formed immediately under the P base layer 2 and acts as a barrier against holes implanted from the back surface of the N layer 4, whereby holes accumulate right under the P base layer 2 and the resistance of the N− substrate 1 decreases. In short, since the N layer 4 is formed on the entire surface under the P base layer 2, holes implanted from the P+ collector layer 6 will not easily reach the P base layer 2 unlike in FIG. 36 but accumulate under the P base layer 2. This suppresses an increase of the ON-voltage of the IGBT.

A description will now be given on an operation which is performed when the IGBTs included in the semiconductor device 100 change from the ON-state to the OFF-state.

In the semiconductor device 100 shown in FIG. 1, when the gate voltage $V_{GE}$ applied between the emitter electrode 11 and the gate electrodes 9 is reduced to zero or reversed (i.e., when the gate is turned off), the channel inverted to the N-type returns back to the P-type and ion implantation from the emitter electrode 11 stops. As electron implantation stops, implantation of holes from the P+ collector layer 6 also stops. Following this, electrons and holes accumulated in the N− substrate 1 will either move all the way respectively to the collector electrode 12 and the emitter electrode 11 or get recombined with each other and disappear. As the N layer 4 formed immediately under the P base layer 2 gets depleted as this occurs, a turning-off characteristic of the IGBT is not adversely affected. In addition, the area between the grooves 7 where no emitter region 3 is formed remains free from any parasite operation.

The ON-state of the diodes included in the semiconductor device 100 will now be described. In the semiconductor device 100, the N+ cathode layer 5 is formed on the back surface of the N− substrate 1. Due to this, as energy developing in a load L for instance applies a voltage $V_{EC}$ upon the IGBTs included in the semiconductor device 100, the diodes formed between the N+ cathode layer 5 and the P base layer 2 turn on and carry a current. The diodes function as the diodes which are connected anti-parallel in FIG. 34 for example.

According to the present invention, the IGBT areas and the diode areas are isolated by the grooves 7. In other words, the grooves 7 isolate those areas wherein the emitter regions 3 are formed and operating mainly as the IGBTs from those areas wherein no emitter region 3 is formed and operating mainly as the diodes. The widths of the areas in particular where no emitter region 3 is formed are wider than in the semiconductor device 1100 which is shown in FIG. 36.

Within the areas wherein the emitter regions 3 are formed and operating mainly as the IGBTs, turning on of the gates of the IGBTs electrically connects the N layer 4 with the emitter regions 3 in the channels. In consequence, due to the potential at the emitter electrode 11, the emitter regions 3 and the P base layer 2 are fixed at this potential. That is, the P base layer 2 and the N layer 4 as well reach the same potential, which discourages the diode operation.

In the areas wherein no emitter region 3 is formed however, unlike in the areas bearing the emitter regions 3, turning on of the gates will not electrically connect the N layer 4 with the P base layer 2 in the channels and will not influence the diode operation very much.

Hence, as compared with where the emitter regions 3 are not formed all over the areas (FIG. 36), a VF increase at the diodes is more discouraged at the time of turning on of the gates. Further, as the areas not bearing the emitter regions 3 are wide, the operation margin as the diodes increases, which reduces VF of the diodes.

A method of manufacturing the semiconductor device 100 will now be described with reference to FIGS. 2 through 11. This manufacturing method includes the following steps (1) through (10). FIGS. 2 through 11 are cross sectional views of the respective manufacturing steps. In FIGS. 2 through 11, the same numerals as those used in FIG. 1 are the same or corresponding portions.

Figure 2:
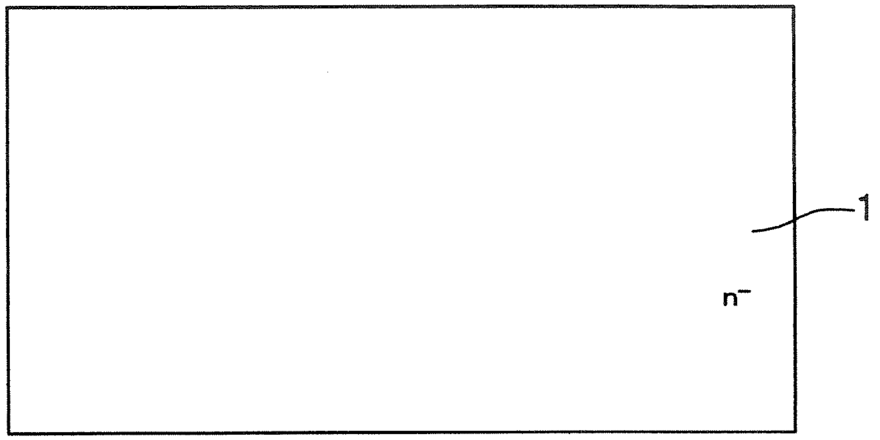
FIG. 2 is a cross sectional view of a step of manufacturing the semiconductor device according to the embodiment 1 of the present invention.

Step (1): As shown in FIG. 2, the N− substrate 1 having a front surface and a back surface is prepared. The N− substrate 1 is made of N-type silicon for instance.

Figure 3:
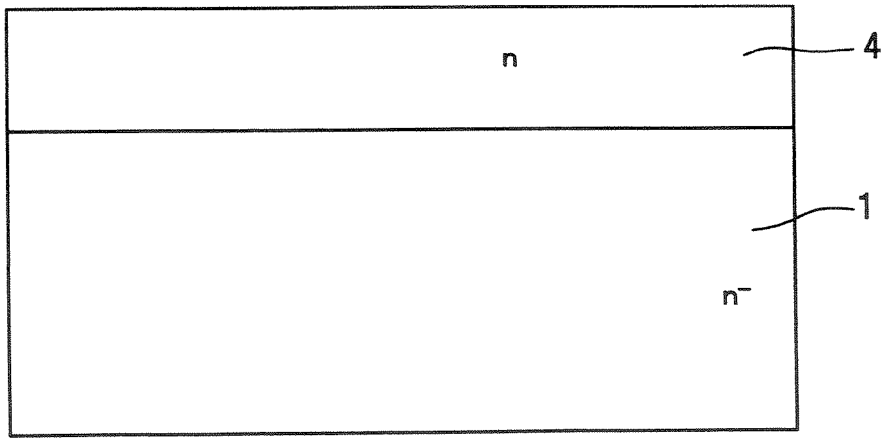
FIG. 3 is a cross sectional view of a step of manufacturing the semiconductor device according to the embodiment 1 of the present invention.

Step (2): As shown in FIG. 3, N-type impurities are diffused by a diffusion method for example in the front surface of the N− substrate 1, thereby forming the N layer 4.

Figure 4:
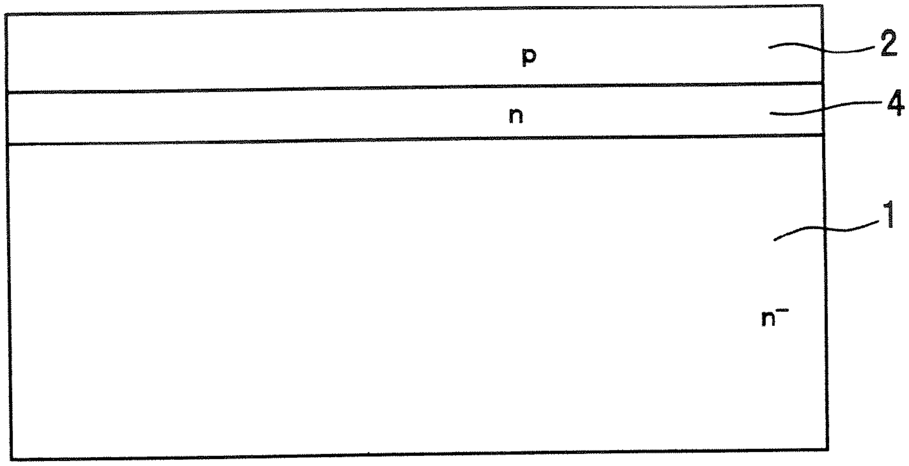
FIG. 4 is a cross sectional view of a step of manufacturing the semiconductor device according to the embodiment 1 of the present invention.

Step (3): As shown in FIG. 4, P-type impurities are diffused within the N layer 4 formed in the N− substrate 1 by a diffusion method for instance, thereby forming the P base layer 2.

Figure 5:
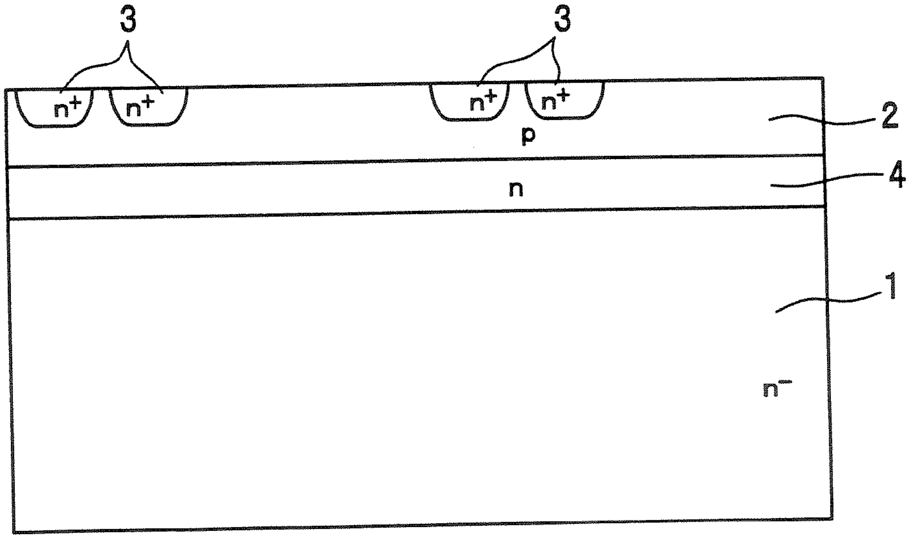
FIG. 5 is a cross sectional view of a step of manufacturing the semiconductor device according to the embodiment 1 of the present invention.

Step (4): As shown in FIG. 5, N-type impurities are selectively diffused by a diffusion method for example in the surface of the P base layer 2, thereby forming the emitter regions 3.

Figure 6:
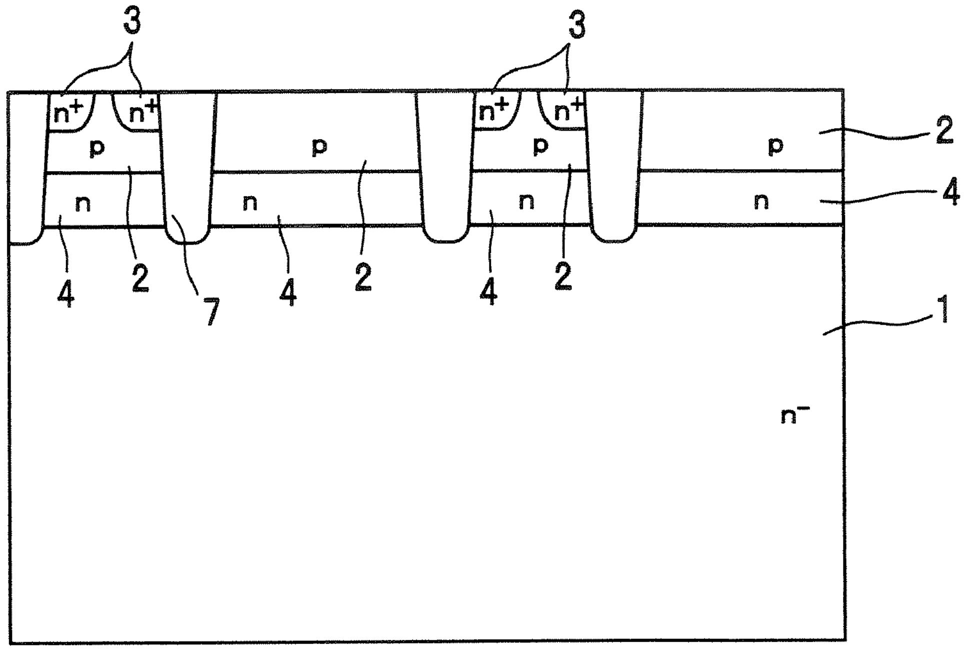
FIG. 6 is a cross sectional view of a step of manufacturing the semiconductor device according to the embodiment 1 of the present invention.

Step (5): As shown in FIG. 6, the grooves (first grooves) 7 are formed which extend from the surface of the P base layer 2, penetrate the N layer 4 and reach the N− substrate 1. The grooves 7 are formed so that two grooves 7 will be paired and the emitter regions 3 will be located in the areas between the grooves 7. The grooves 7 are formed by dry etching for example. In FIG. 6, two sets of groove pairs 7 are formed.

Figure 7:
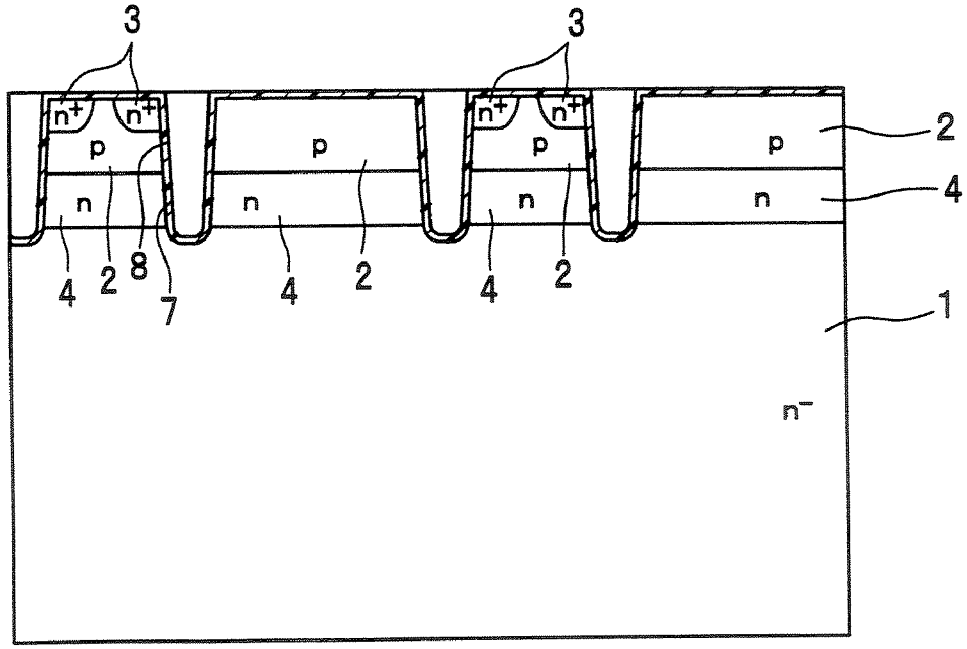
FIG. 7 is a cross sectional view of a step of manufacturing the semiconductor device according to the embodiment 1 of the present invention.

Step (6): As shown in FIG. 7, the surfaces of the inner walls of the grooves 7, the P base layer 2 and the emitter regions 3 are oxidized by thermal oxidation for example, thereby forming the gate insulation films (silicon oxide films) 8.

Figure 8:
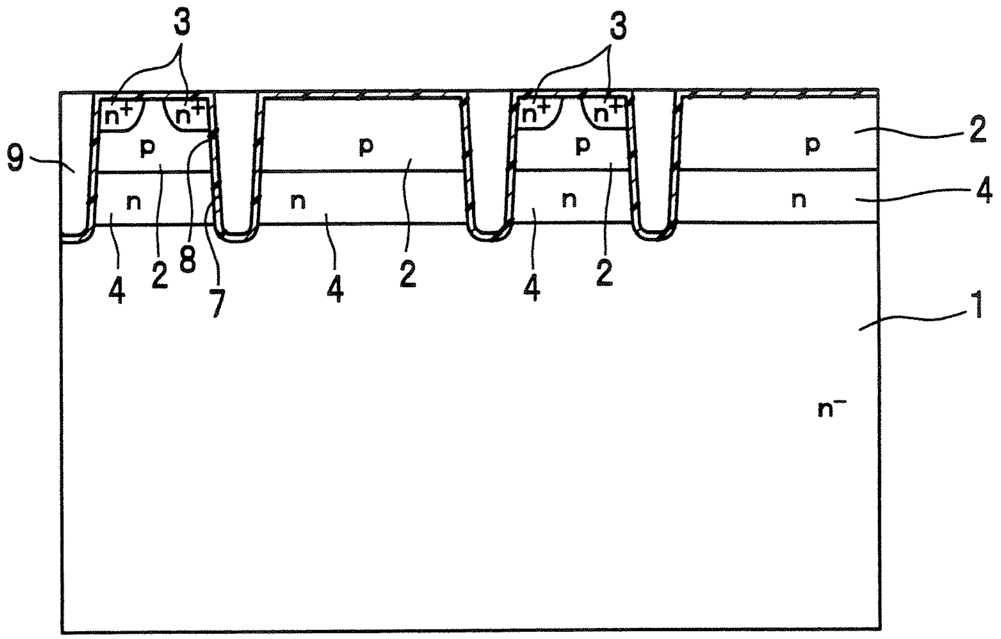
FIG. 8 is a cross sectional view of a step of manufacturing the semiconductor device according to the embodiment 1 of the present invention.

Step (7): As shown in FIG. 8, a poly-silicon layer is deposited (not shown) all over the front surface of the N− substrate 1, and etching, polishing or the like is performed, leaving poly-silicon only in the grooves 7. Poly-silicon remaining in the grooves 7 will become the gate electrodes 9.

Figure 9:
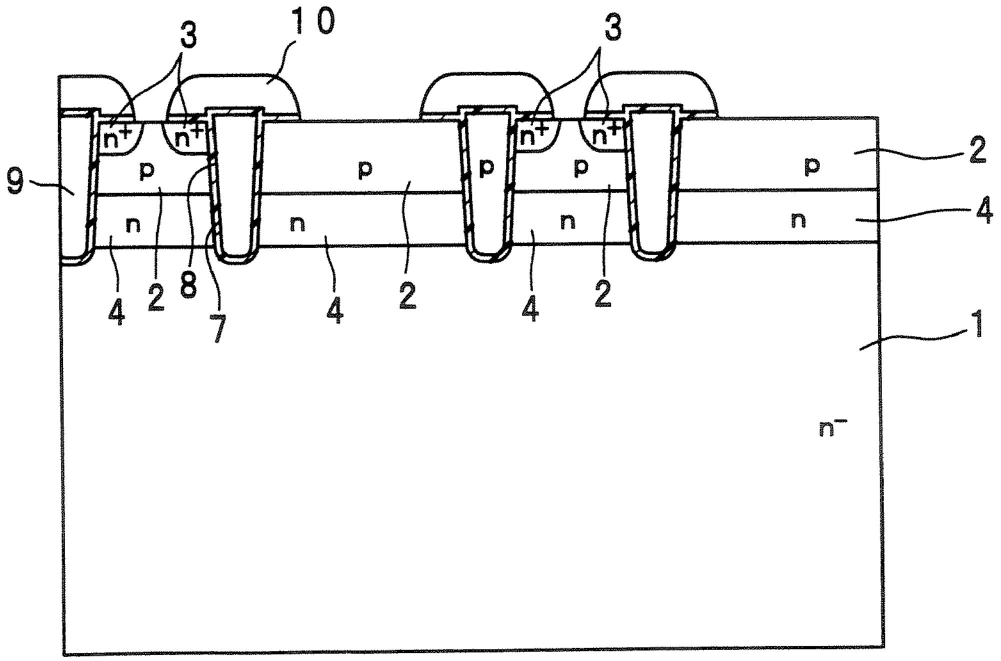
FIG. 9 is a cross sectional view of a step of manufacturing the semiconductor device according to the embodiment 1 of the present invention.

Step (8): As shown in FIG. 9, the inter-layer insulation films 10 are formed so as to cover the grooves 7 in which poly-silicon has been buried and partially cover the emitter regions 3. The inter-layer insulation films 10 are made of silicon oxide for instance.

Figure 10:
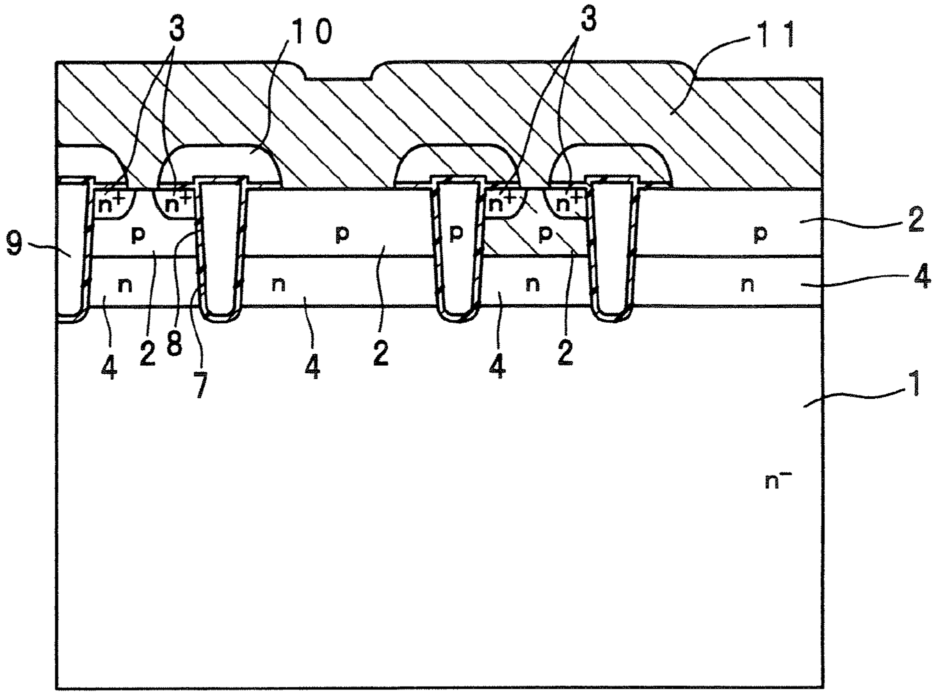
FIG. 10 is a cross sectional view of a step of manufacturing the semiconductor device according to the embodiment 1 of the present invention.

Step (9): As shown in FIG. 10, using the inter-layer insulation films 10 as a mask, the silicon oxide films (gate oxide films 8) on the surfaces of the P base layer 2 and the emitter regions 3 are removed, and the surfaces of the P base layer 2 and the emitter regions 3 are accordingly exposed. This is followed by vapor deposition of aluminum for example, thereby forming the emitter electrode 11. In this manner, the P base layer 2 and the emitter regions 3 are electrically connected with the emitter electrode 11.

Figure 11:
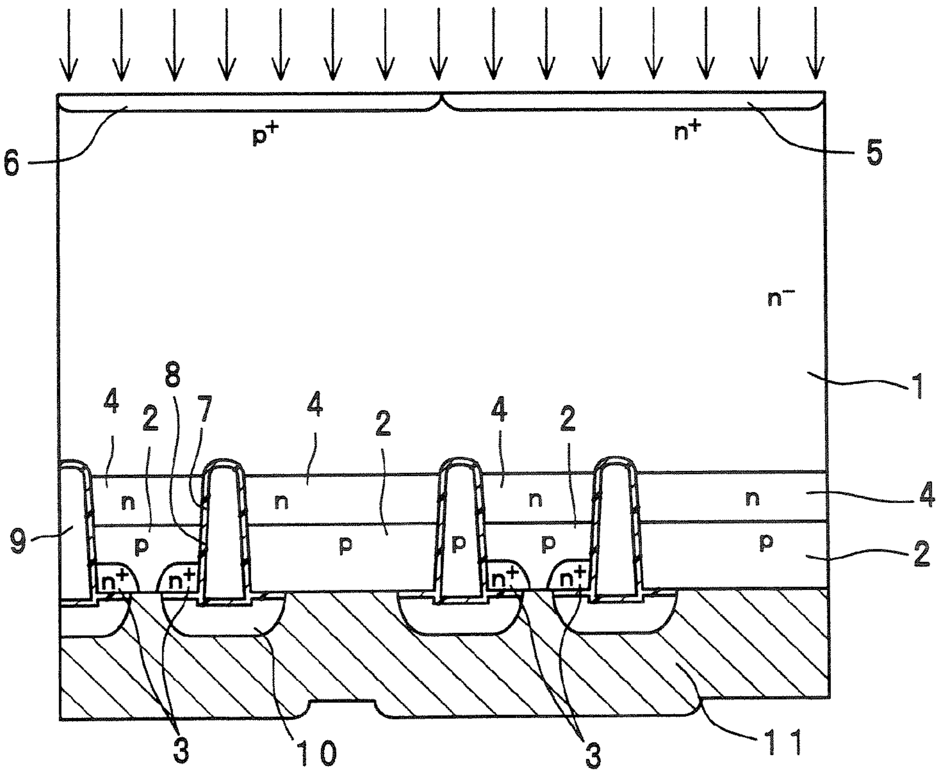
FIG. 11 is a cross sectional view of a step of manufacturing the semiconductor device according to the embodiment 1 of the present invention.

Step (10): As shown in FIG. 11, phosphorus and boron are implanted to the back surface of the N− substrate 1 and activated. As a result, the N+ cathode layer 5 and the P+ collector layer 6 are formed. At last, aluminum for instance is vapor-deposited on the back surface of the N− substrate 1, thereby forming the collector electrode 12.

Through these steps, the semiconductor device 100 which is shown in FIG. 1 is completed.

As for the P+ collector layer 6 and the N+ cathode layer 5 to be formed on the back surface, either one may be formed earlier than the other.

Further, the P+ collector layer 6 and the N+ cathode layer 5 to be formed on the back surface may be formed before or after forming the emitter electrode 11 in the front surface or at any other step.

Embodiment 2

Figure 12:
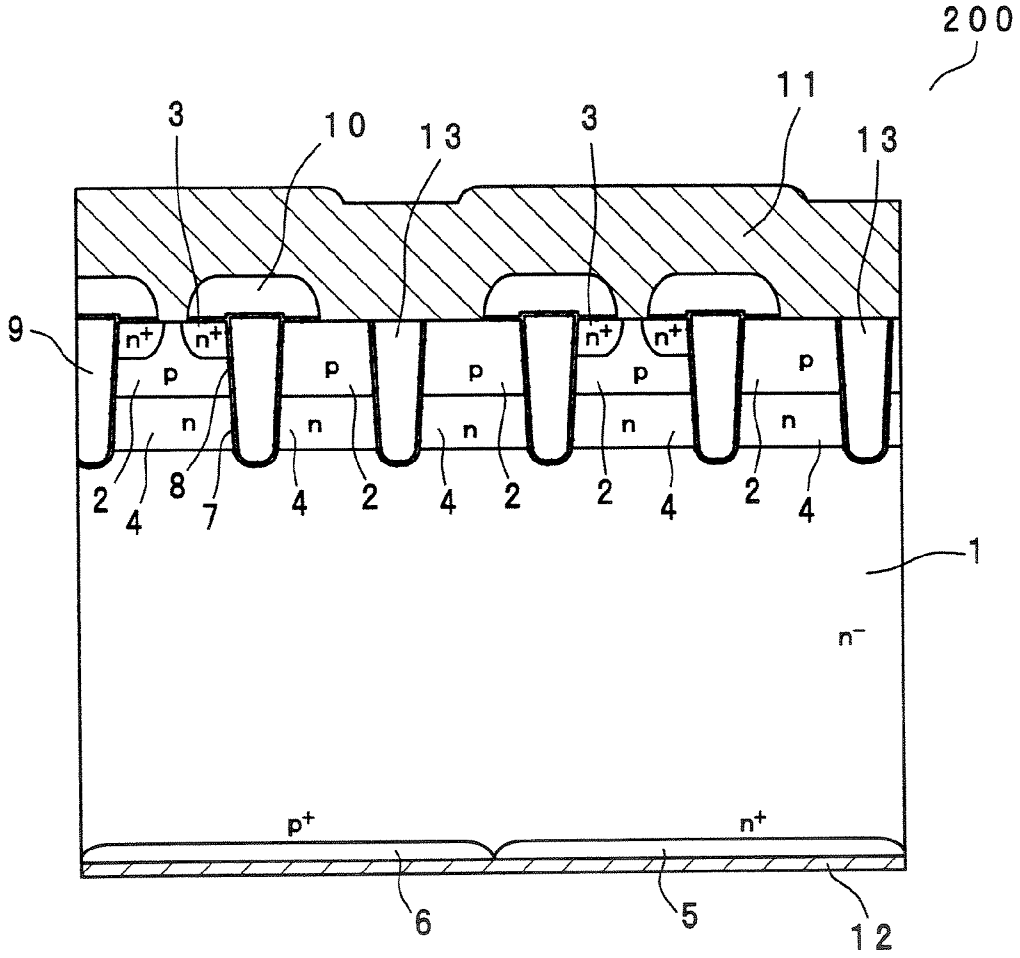
FIG. 12 is a cross sectional view of a semiconductor device according to an embodiment 2 of the present invention.
Figure 13:
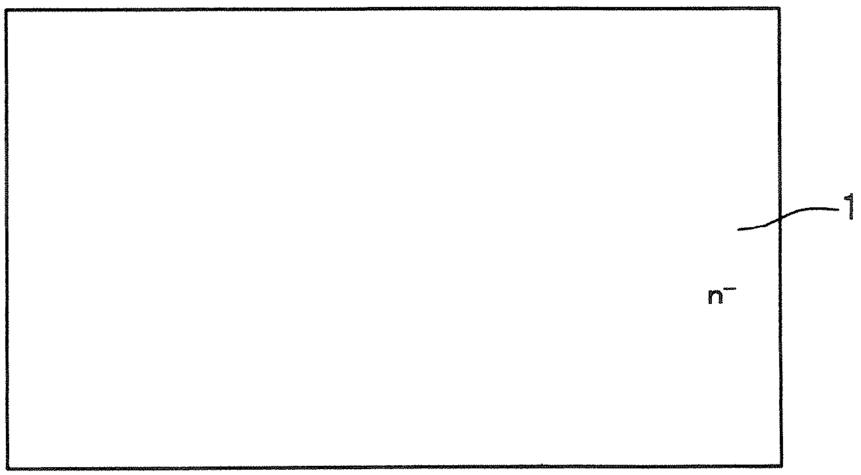
FIG. 13 is a cross sectional view of a step of manufacturing the semiconductor device according to the embodiment 2 of the present invention.
Figure 14:
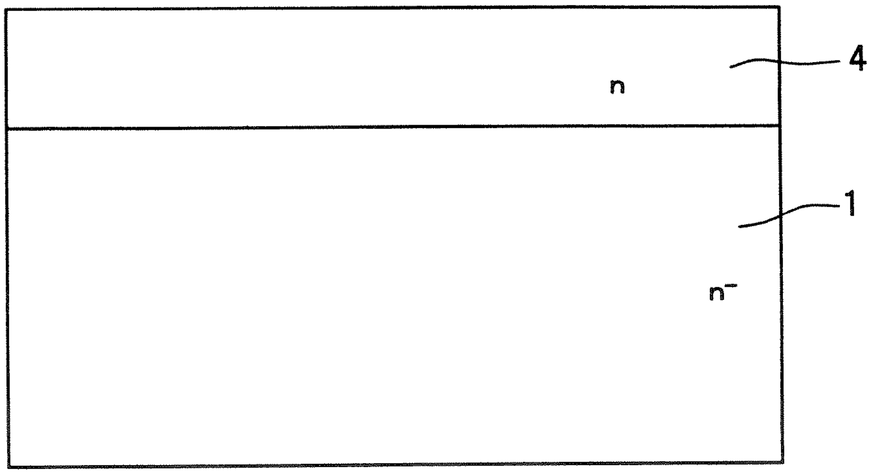
FIG. 14 is a cross sectional view of a step of manufacturing the semiconductor device according to the embodiment 2 of the present invention.
Figure 15:
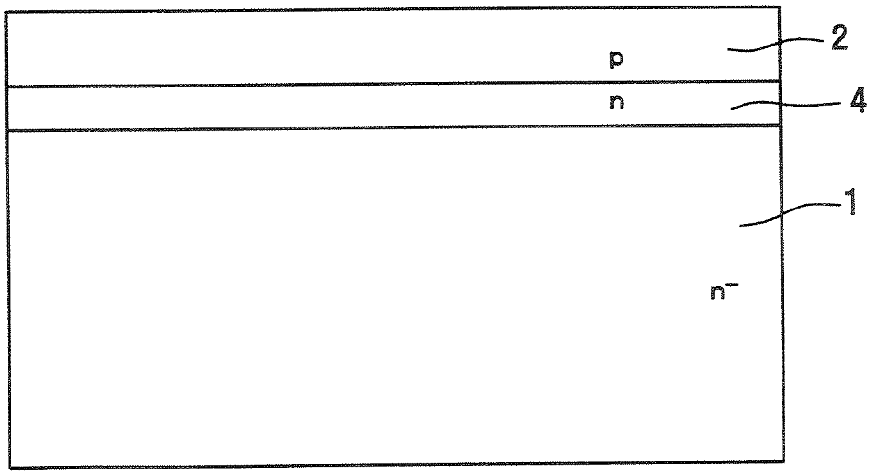
FIG. 15 is a cross sectional view of a step of manufacturing the semiconductor device according to the embodiment 2 of the present invention.
Figure 16:
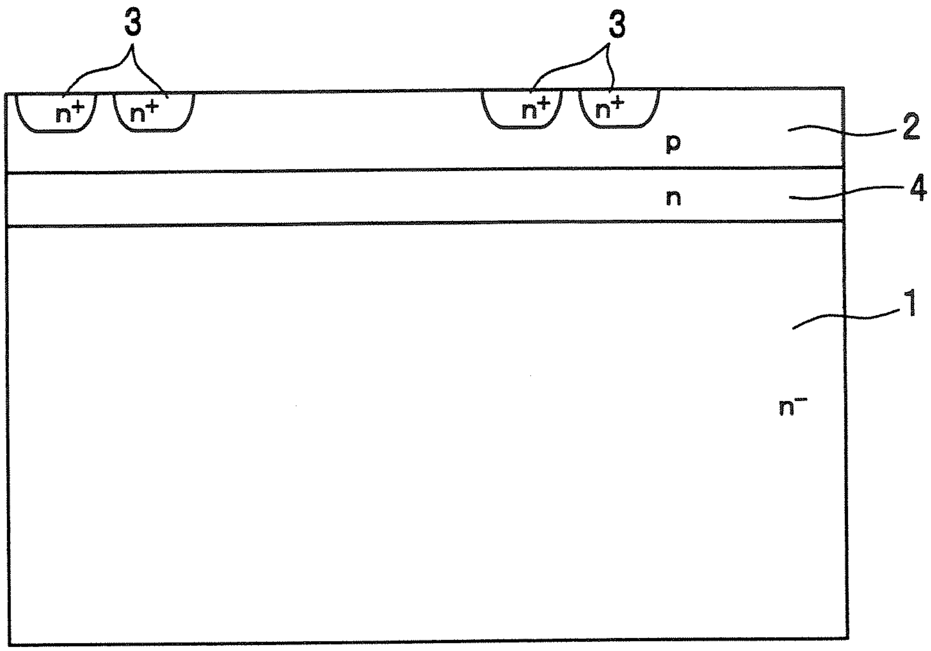
FIG. 16 is a cross sectional view of a step of manufacturing the semiconductor device according to the embodiment 2 of the present invention.

FIG. 12 is a cross sectional view of a semiconductor device generally denoted at 200 according to the embodiment 2 of the present invention. In FIG. 12, the same numerals as those used in FIG. 1 are the same or corresponding portions.

In the semiconductor device 200, two sets of groove pairs 7 are formed as in the semiconductor device 100, and further, in the areas between the grooves 7 where no emitter region 3 is formed, second grooves 13 are formed. The inner walls of the second grooves 13 as well seat silicon oxide films in which poly-silicon is disposed. Poly-silicon inside the second grooves 13 is electrically connected with the emitter electrode 11. The structure is otherwise similar to that of the semiconductor device 100.

An operation of the semiconductor device 200 as well is basically the same as that of the semiconductor device 100 described above.

In the semiconductor device 100, if the widths of the areas not bearing the emitter regions 3 (the gaps between the adjacent first grooves 7) are wide in an attempt to lower VF of the diodes, an electric field will intensify at the front ends of the first grooves 7 and the breakdown voltage could decrease.

In the semiconductor device 200 according to the embodiment 2, there are the second grooves 13 in the areas between the adjacent first grooves 7 where no emitter region 13 is formed. The poly-silicon layers formed in the grooves 13 are approximately at the same potential as the emitter electrode 11. Owing to this, the second grooves 13 moderate an electric field near front end sections of the first grooves 7.

It is therefore possible to ensure wider areas between the first grooves 7 where no emitter region 13 is formed than in the semiconductor device 100, widen the P base layer 2 which will not reach the same potential as the N layer 4 during turning on of the gates, and better suppress an increase of VF of the diodes. Hence, the design margin is larger than in the semiconductor device 100.

Further, unlike in the semiconductor device 1100 which is shown in FIG. 36, no Schottky region is formed between the first grooves 7, due to which the second grooves 13 will never cause a drop of the breakdown voltage of the semiconductor device 200.

Considering mitigation of an electric field, it is desirable that the gaps between the first grooves 7 and the second grooves 13 are equal to or narrower than the gaps between the first grooves 7.

A method of manufacturing the semiconductor device 200 will now be described with reference to FIGS. 13 through 21. This manufacturing method includes the following steps (1) through (10). FIGS. 13 through 21 are cross sectional views of the respective manufacturing steps. In FIGS. 13 through 21, the same reference symbols as those used in FIG. 12 are the same or corresponding portions.

Steps (1)-(4): As shown in FIGS. 13 through 16, through the same steps as those of the method of manufacturing the semiconductor device 100 according to the embodiment 1, the N layer 4, the P base layer 2 and the emitter regions 3 are formed on the front surface of the N− substrate 1.

Figure 17:
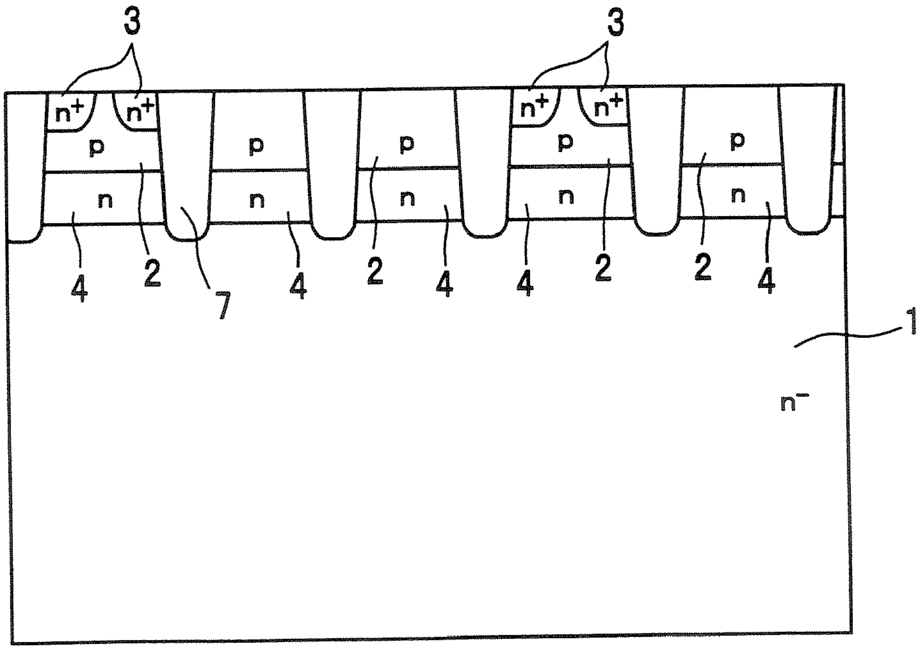
FIG. 17 is a cross sectional view of a step of manufacturing the semiconductor device according to the embodiment 2 of the present invention.

Step (5): As shown in FIG. 17, the grooves (first grooves) 7 are formed which extend from the surface of the P base layer 2, penetrate the N layer 4 and reach the N− substrate 1. The grooves 7 are formed so that two grooves 7 will be paired and the emitter regions 3 will be located in the areas between the grooves 7. At this step, separately from the grooves 7 adjacent the emitter regions 3, between the two sets of the groove pairs 7 (i.e., approximately in the middle), the second grooves 13 having the same shape are further formed.

Figure 18:
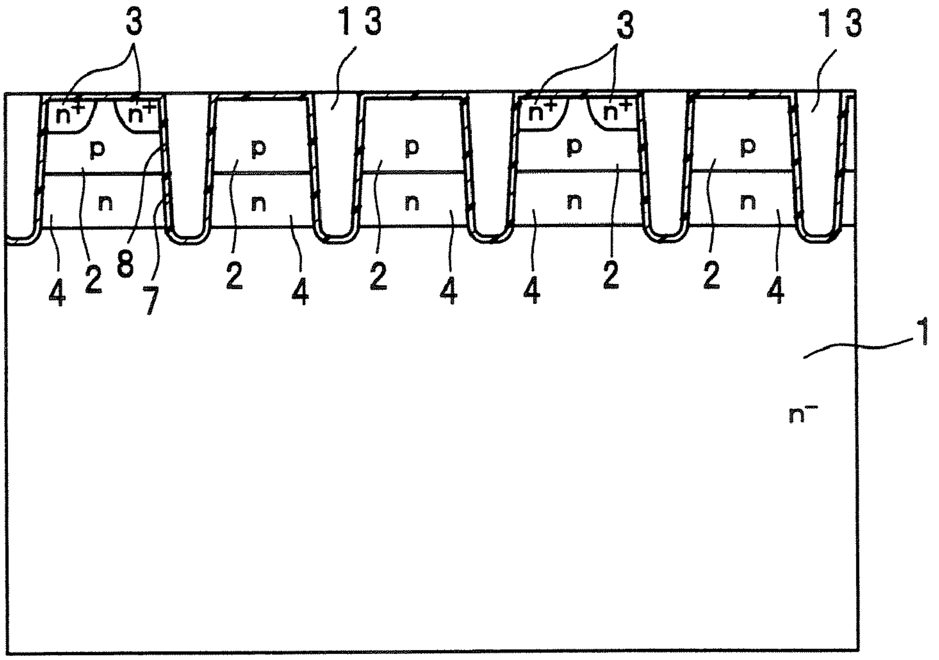
FIG. 18 is a cross sectional view of a step of manufacturing the semiconductor device according to the embodiment 2 of the present invention.

Step (6): As shown in FIG. 18, the surfaces of the inner walls of the grooves 7 and the second grooves 13, the P base layer 2 and the emitter regions 3 are oxidized by thermal oxidation for example, thereby forming the gate insulation films (silicon oxide films) 8.

Figure 19:
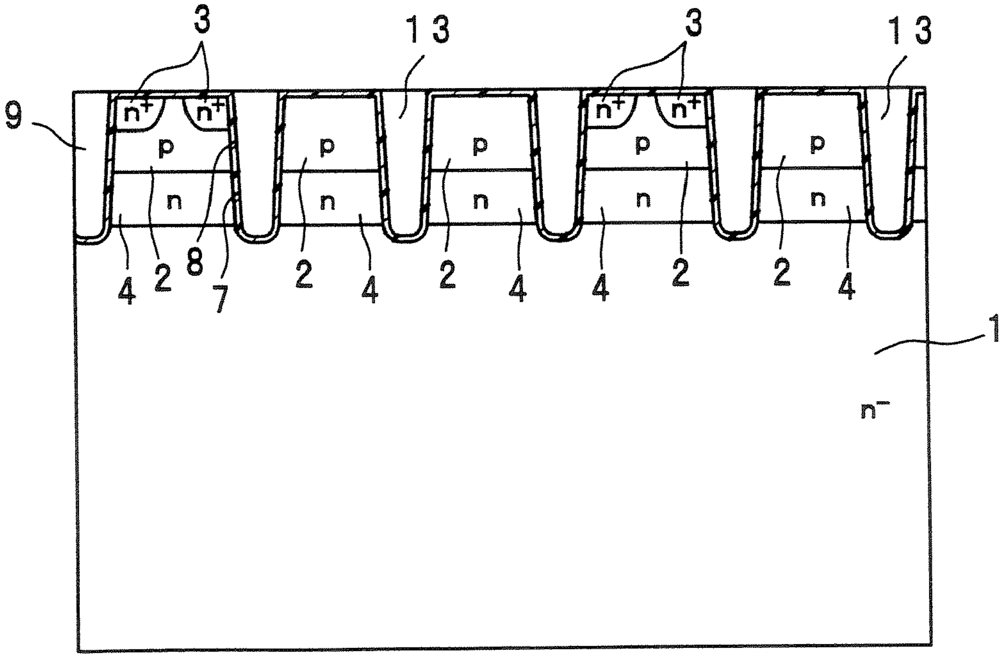
FIG. 19 is a cross sectional view of a step of manufacturing the semiconductor device according to the embodiment 2 of the present invention.

Step (7): As shown in FIG. 19, a poly-silicon layer is deposited (not shown) all over the front surface of the N− substrate 1, and by etching or the like, poly-silicon is left only in the grooves 7. Poly-silicon remaining in the grooves 7 will become the gate electrodes 9.

Figure 20:
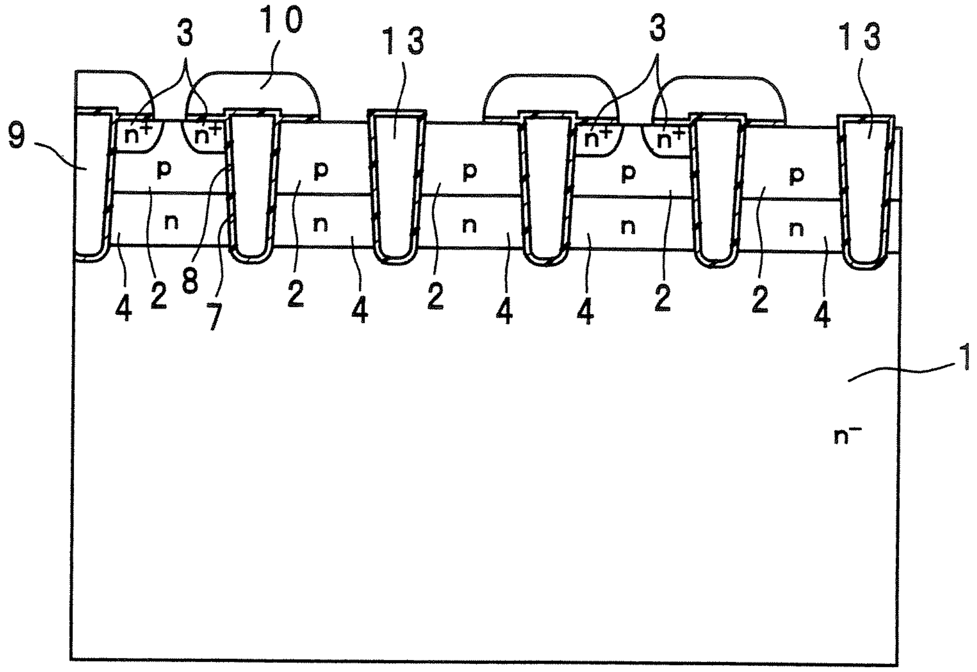
FIG. 20 is a cross sectional view of a step of manufacturing the semiconductor device according to the embodiment 2 of the present invention.

Step (8): As shown in FIG. 20, the inter-layer insulation films 10 are formed so as to cover the grooves 7 in which poly-silicon has been buried and partially cover the emitter regions 3. The inter-layer insulation films 10 are not formed on the second grooves 13. The inter-layer insulation films 10 are made of silicon oxide for instance.

Figure 21:
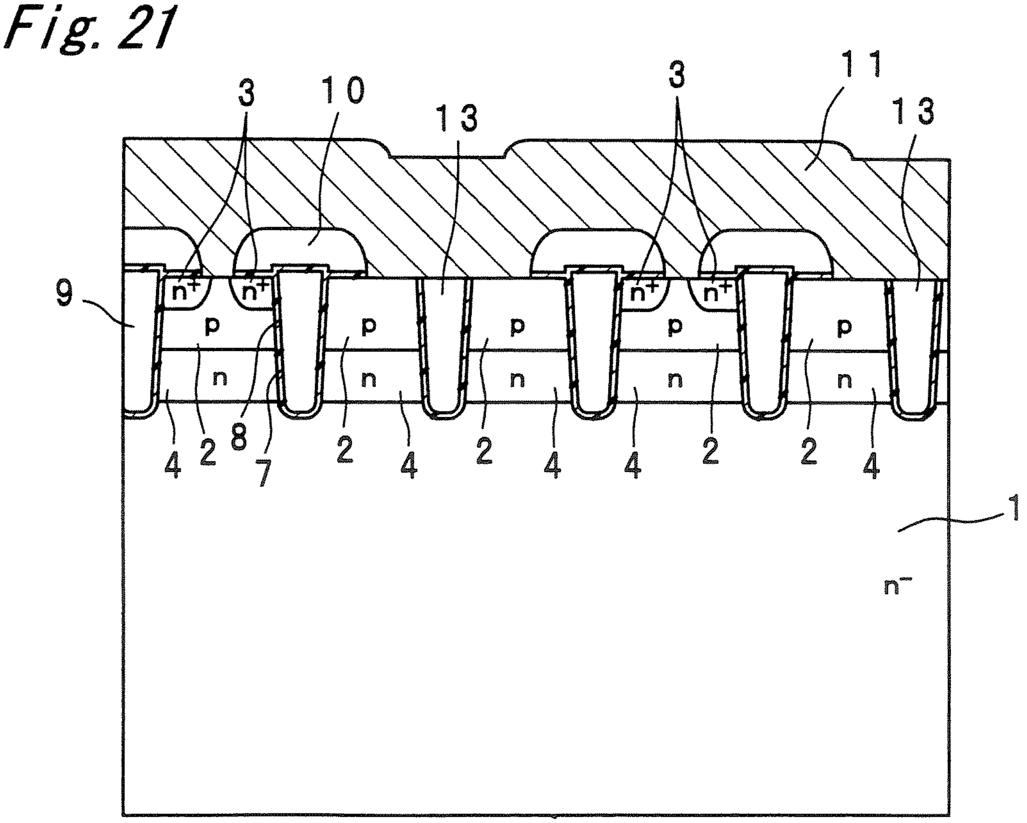
FIG. 21 is a cross sectional view of a step of manufacturing the semiconductor device according to the embodiment 2 of the present invention.

Step (9): As shown in FIG. 21, using the inter-layer insulation films 10 as a mask, the silicon oxide films (gate oxide films 8) on the P base layer 2 and the emitter regions 3 as well as the surfaces of poly-silicon buried in the second grooves 13 are removed, and the surfaces of the P base layer 2, the emitter regions 3 and the poly-silicon surfaces are accordingly exposed. This is followed by vapor deposition of aluminum for example, thereby forming the emitter electrode 11. In this manner, the P base layer 2, the emitter regions 3 and poly-silicon inside the second grooves 13 are electrically connected with the emitter electrode 11.

Step (10): Phosphorus and boron are implanted to the back surface of the N− substrate 1 and activated. As a result, the N+ cathode layer 5 and the P+ collector layer 6 are formed. At last, aluminum for instance is vapor-deposited on the back surface of the N− substrate 1, thereby forming the collector electrode 12.

Through these steps, the semiconductor device 200 which is shown in FIG. 12 is completed.

Figure 22:
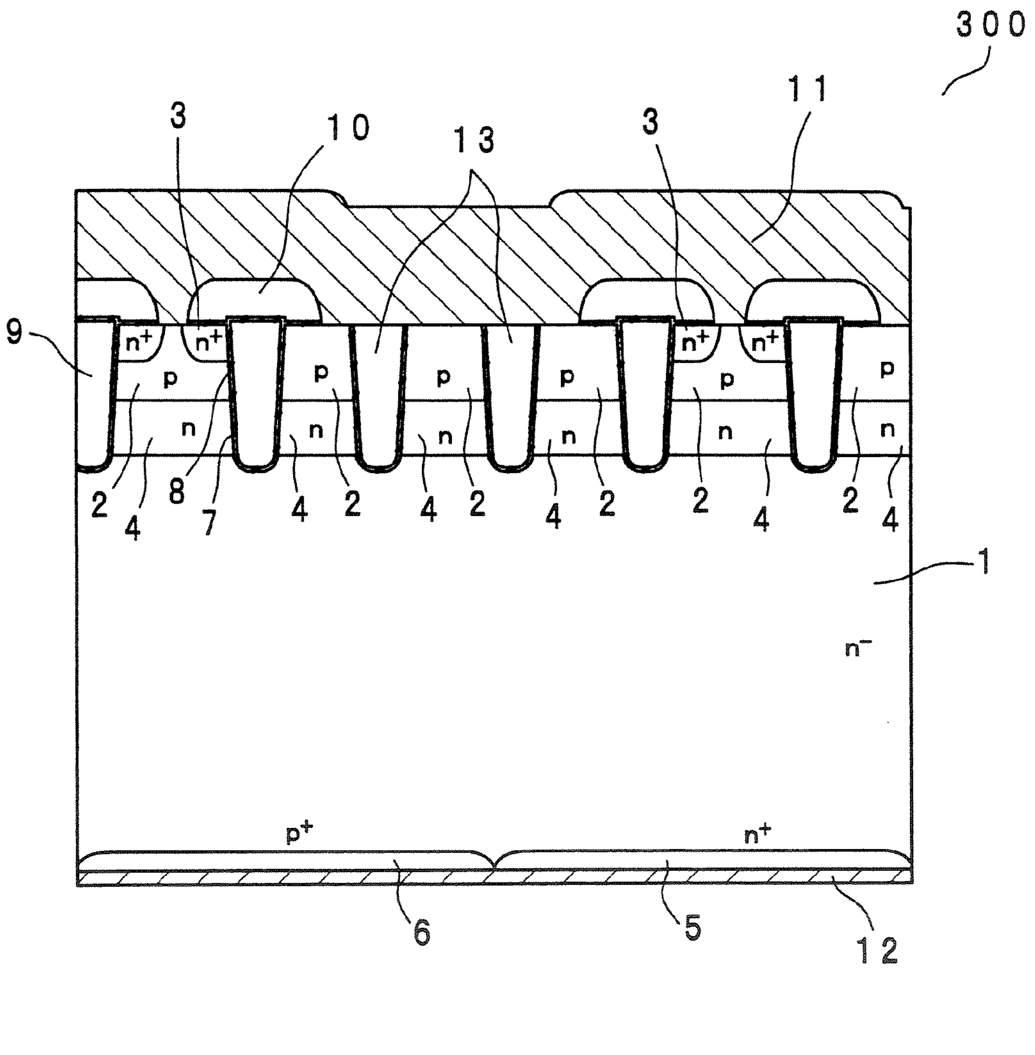
FIG. 22 is a cross sectional view of a semiconductor device according to the embodiment 2 of the present invention.

FIG. 22 is a cross sectional view of other semiconductor device generally denoted at 300 according to the embodiment 2 of the present invention. In FIG. 22, the same numerals as those used in FIG. 1 are the same or corresponding portions. When one wishes to widen the areas between the first grooves 7 where no emitter region 13 is formed, it is preferable, for mitigation of an electric field, to form the plural second grooves 13 as in the semiconductor device 300 shown in FIG. 22. To moderate an electric field, the gaps between the second grooves 13 are equal to or narrower than the gaps between the first grooves 7.

Particularly in the P base layer 2 located between the adjacent second grooves 13 where no emitter region 3 is formed, it is possible to suppress a VF increase at the diodes than in the P base layer 2 located between the first grooves 7 where no emitter region 3 is formed within the semiconductor device 100.

Embodiment 3

Figure 23:
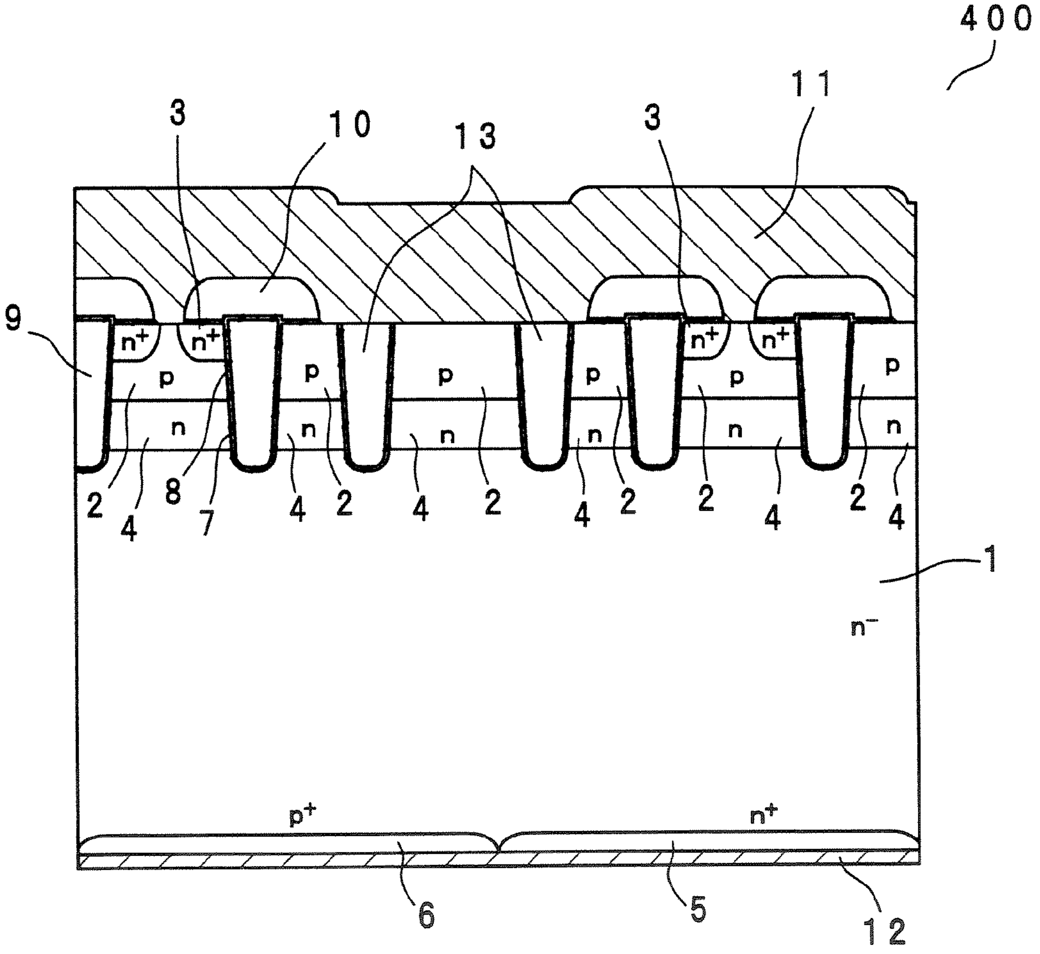
FIG. 23 is a cross sectional view of a semiconductor device according to an embodiment 3 of the present invention.

FIG. 23 is a cross sectional view of a semiconductor device generally denoted at 400 according to the embodiment 3 of the present invention. In FIG. 23, the same numerals as those used in FIG. 1 are the same or corresponding portions.

In the semiconductor device 400, the gaps between the adjacent second grooves 13 are wider than the gaps between the first grooves 7 and the second grooves 13. The structure is otherwise similar to that of the semiconductor device 300.

In the semiconductor device 400, as the gates of the first grooves 7 turn on, the P base layer 2 in the vicinity of the gate electrodes 9 changes to the N-type. Meanwhile, due to the second grooves 13 having poly-silicon which is approximately at the same potential as the emitter electrode 11, the first grooves 7 is less influential over the P base layer 2 which is between the second grooves 13 where no emitter region 3 is formed.

In short, the P base layer 2 which is between the second grooves 13 where no emitter region 3 is formed is further narrower than the P base layer 2 which is between the first grooves 7 where no emitter region 3 is formed within the semiconductor device 100. As the gaps between the first grooves 7 and the second grooves 13 are narrower than in the semiconductor device 300 which is shown in FIG. 22, the areas influenced by an electric field developing in the first grooves 7 are narrow. The P base layer 2 which is between the second grooves 13 where no emitter region 13 is formed functions as the anode of the diode without influenced by an electric field developing in the first grooves 7.

The gaps between the first grooves 7 and the second grooves 13 are preferably equal to or narrower than the gaps between the first grooves 7. Further, the gaps between the second grooves 13 are preferably about the same as the gaps between the first grooves 7.

In addition, in the semiconductor device 400, even though the areas of the P base layer 2 bearing no emitter region 3 are large, the N layer 4 under the P base layer 2 suppresses an increase of the ON-voltage of the IGBT.

Figure 24:
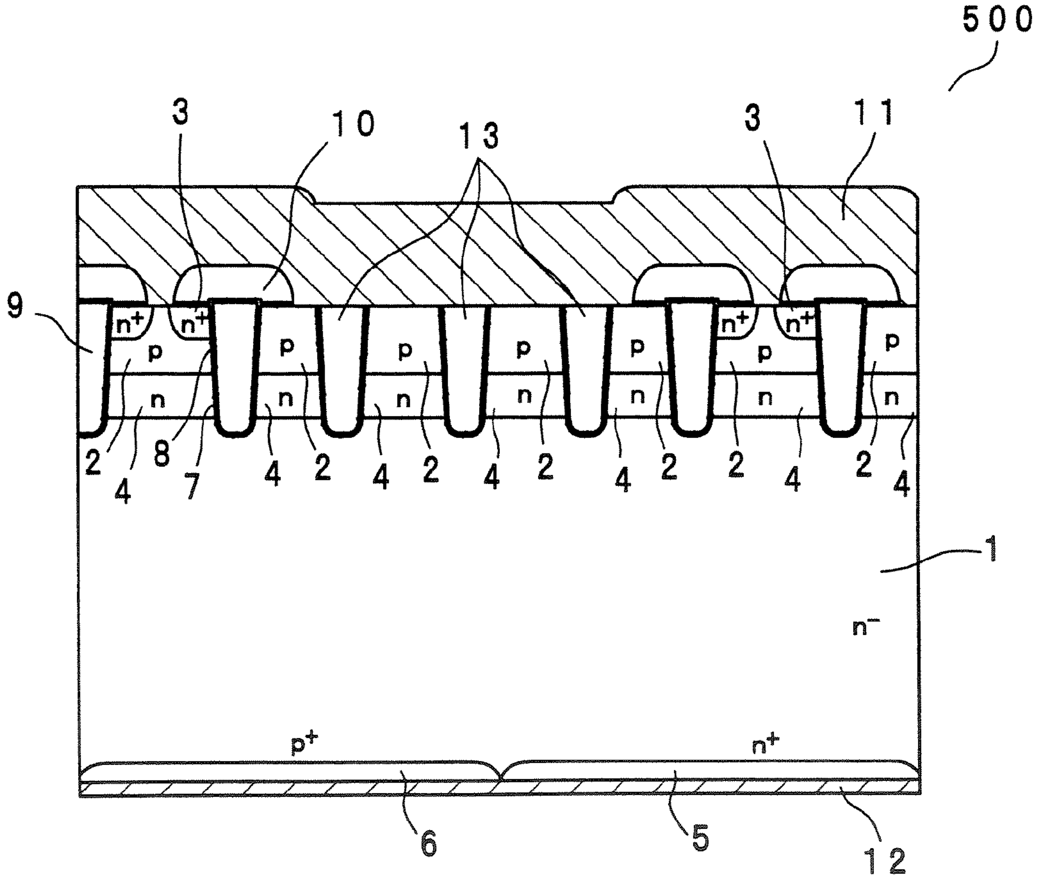
FIG. 24 is a cross sectional view of a semiconductor device according to the embodiment 3 of the present invention.

FIG. 24 is a cross sectional view of other semiconductor device generally denoted at 500 according to the embodiment 3 which improves a diode characteristic. In FIG. 24, the structure is almost the same as that of the semiconductor device 400, except that there are more second grooves 13. In FIG. 24, the same numerals as those used in FIG. 23 are the same or corresponding portions.

As there are more second grooves 13 within the P base layer 2 bearing no emitter region 3, the P base layer 2 bearing no emitter region 3 and free from the influence of the first grooves 7 can be wider. This makes it possible to further suppress a VF increase during turning on of the gate.

Embodiment 4

Figure 25:
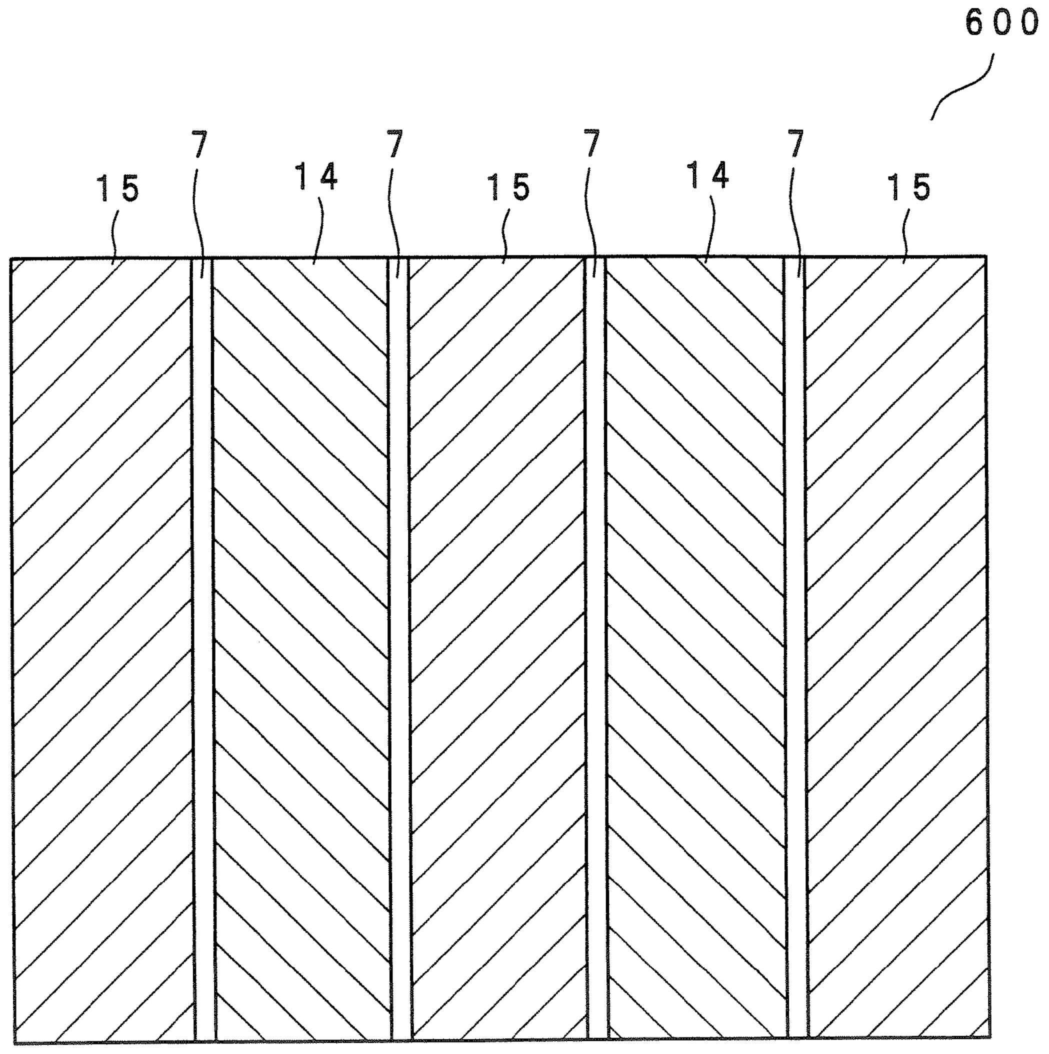
FIG. 25 is a top view of a semiconductor device according to an embodiment 4 of the present invention.
Figure 26:
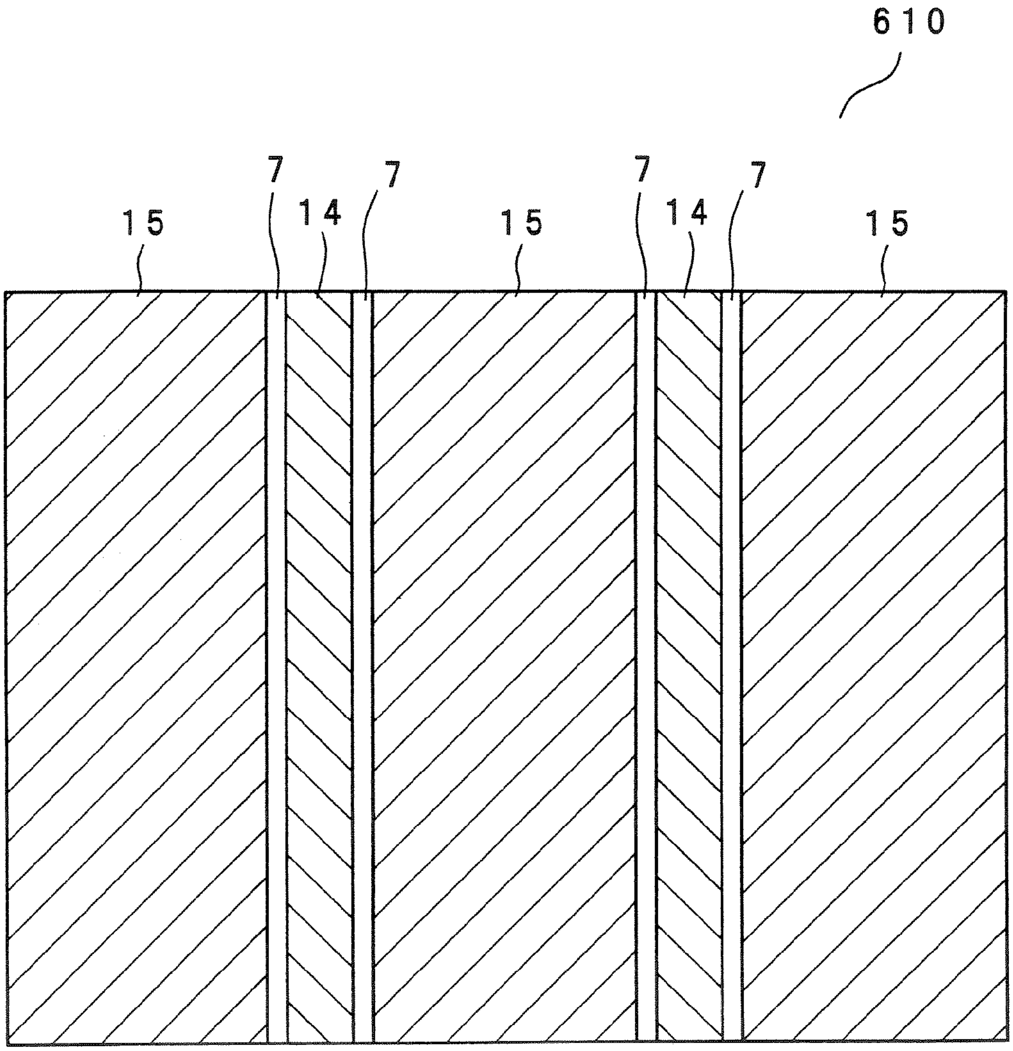
FIG. 26 is a top view of the semiconductor device according to the embodiment 4 of the present invention.

FIGS. 25 and 26 are top views of a unit cell within a semiconductor device generally denoted at 600 according to the embodiment 4 (The emitter electrode 11 is omitted.). In FIGS. 25 and 26, areas 14 of the P base layer 2 in which the emitter regions 3 are formed and areas 15 of the P base layer 2 bearing no emitter region 3 are arranged alternately with the first grooves 7 located between these.

Where the N− substrate 1 (not shown) seats the areas 14 of the P base layer 2 in which the emitter regions 3 are formed and areas 15 of the P base layer 2 bearing no emitter region 3 are arranged each like a stripe alternately with the first grooves 7 located between these, the IGBTs and the diodes can operate approximately uniformly with each other within the N− substrate 1 during their operations.

As shown in FIGS. 25 and 26, the sizes of the areas 14 and the areas 15 may be freely changed.

Alternatively, in the event that the P+ collector layer 6 and the N+ cathode layer 5 formed on the back surface are each shaped like a stripe and intersect the stripe-like areas 14 and 15 formed on the front surface (preferably so as to be orthogonal to each other), the IGBTs and the diodes can operate uniformly.

Figure 27:
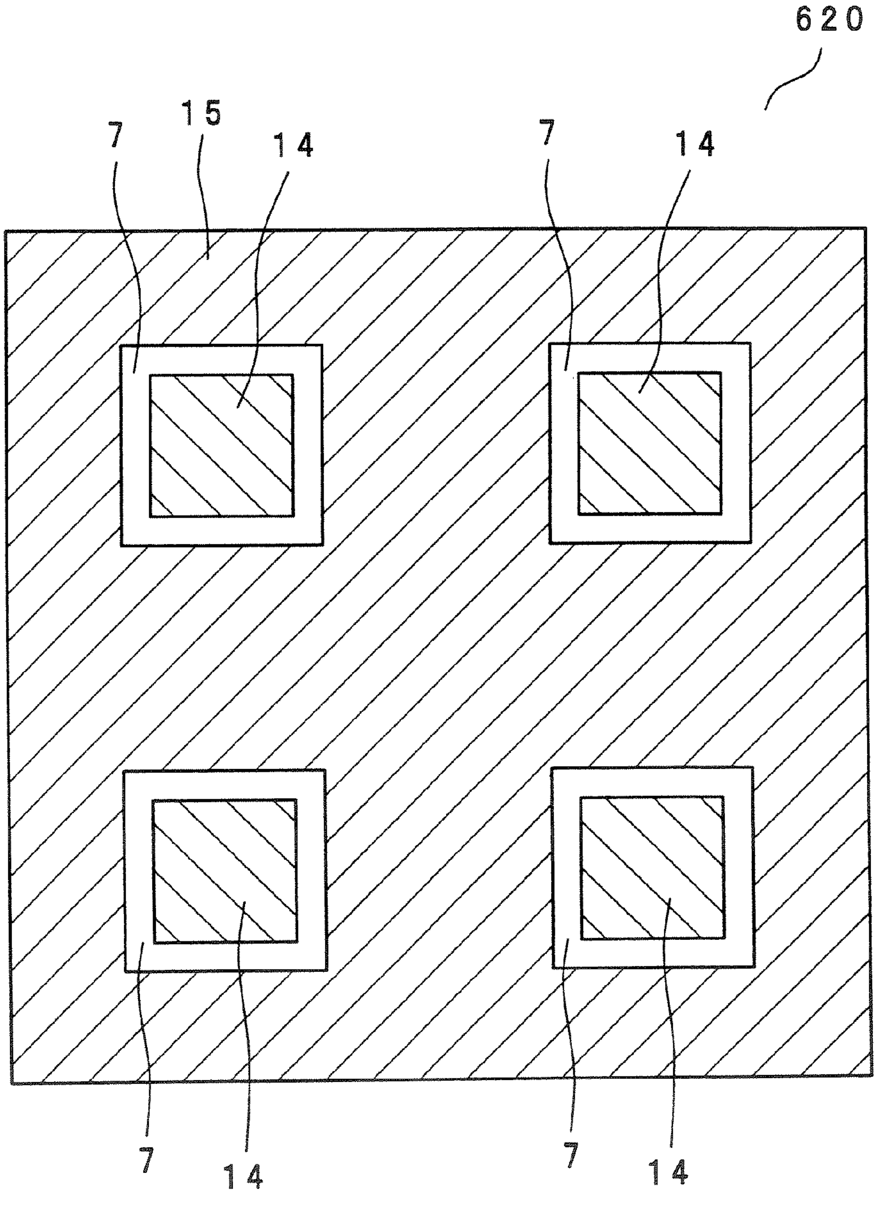
FIG. 27 is a top view of a semiconductor device according to the embodiment 4 of the present invention.

FIG. 27 is a top view of other semiconductor device generally denoted at 650 according to the embodiment 4. In the semiconductor device 650, the first grooves 7 are formed in a rectangular shape (ring shape), inside of which are the areas 14 (the P base layer 2 in which the emitter regions 3 are formed), and outside of which are the areas 15 (the P base layer 2 in which the emitter regions 3 are not formed).

In this layout, the proportion of the areas 15 to the areas 14 is larger than in the semiconductor device 600 described above. This secures wide areas which will operate as the diodes and suppresses a VF increase during turning on of the gates.

Embodiment 5

Figure 28:
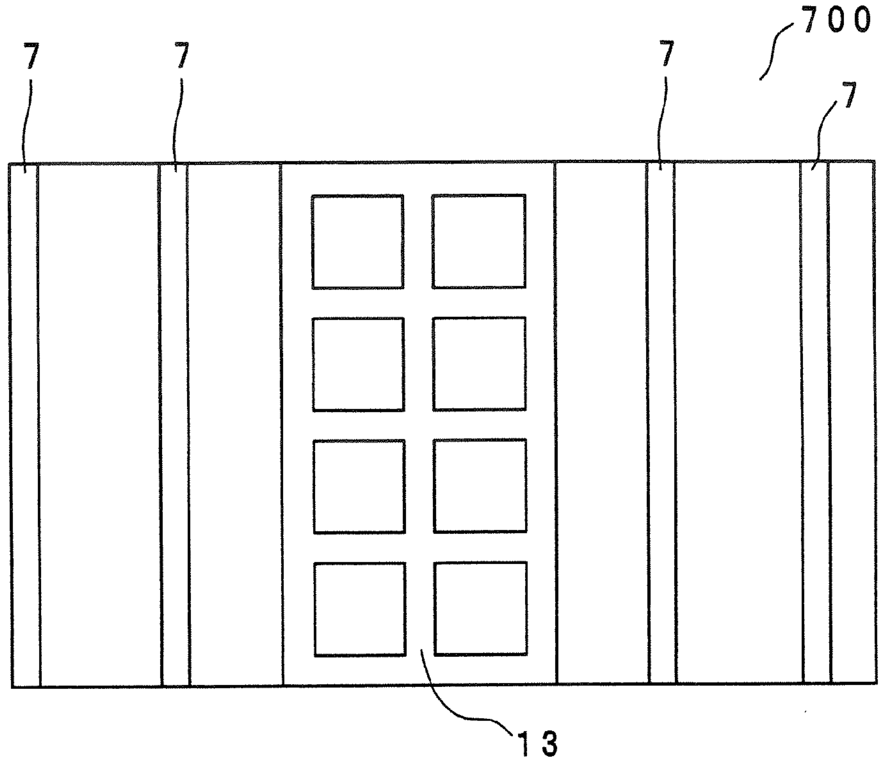
FIG. 28 is a top view of a semiconductor device according to an embodiment 5 of the present invention.
Figure 29:
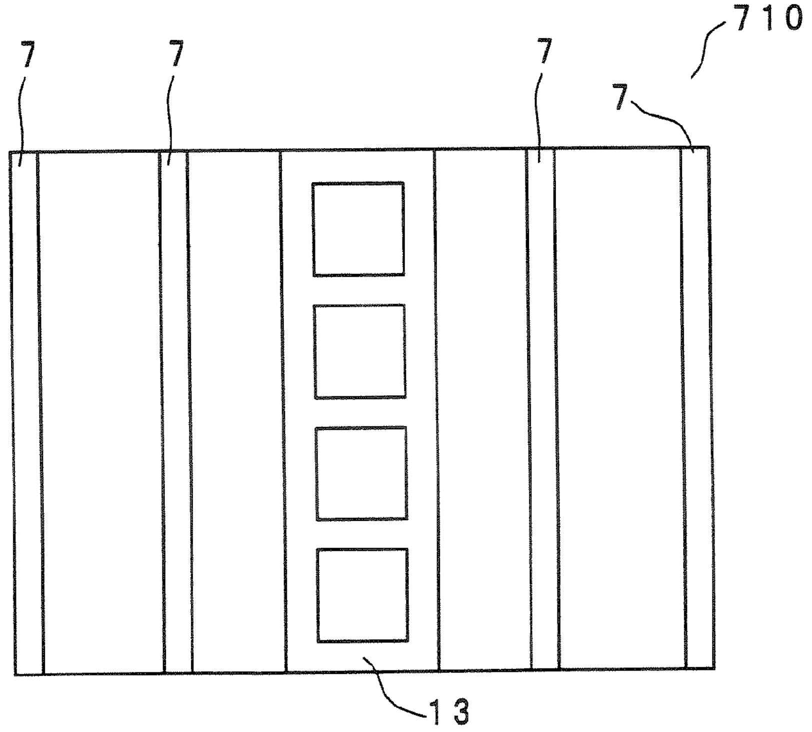
FIG. 29 is a top view of a semiconductor device according to the embodiment 5 of the present invention.
Figure 30:
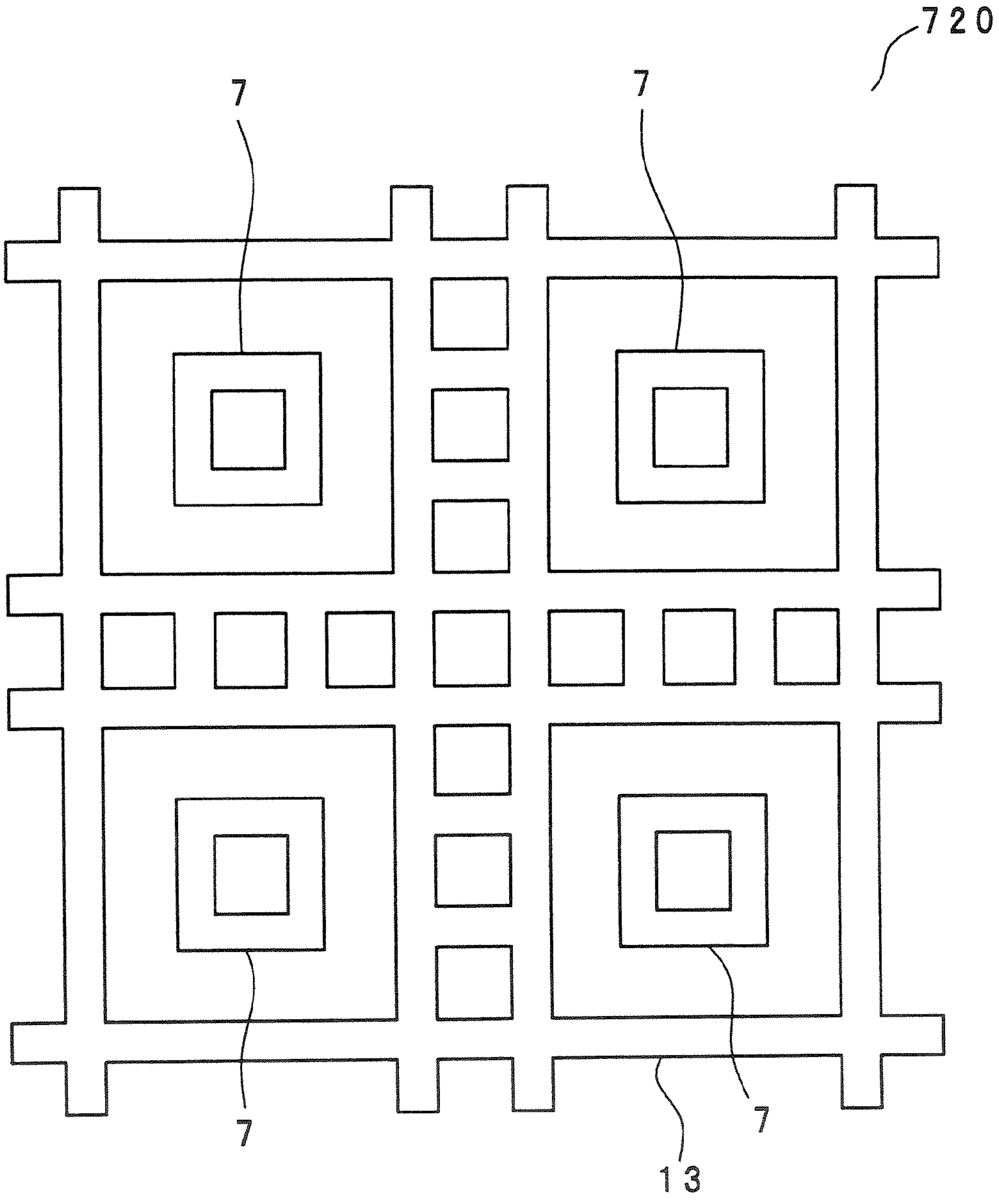
FIG. 30 is a top view of a semiconductor device according to the embodiment 5 of the present invention.

FIGS. 28, 29 and 30 are top views of semiconductor devices generally denoted at 700, 710 and 720 respectively according to the embodiment 5 (The emitter electrode 11 is omitted.).

In the semiconductor devices 700 and 710 shown in FIGS. 28 and 29, the first grooves 7 are formed as stripes (which extend vertically), which feature corresponds to the structure of the semiconductor device 600 (FIG. 25). Meanwhile, in the semiconductor device 720 shown in FIG. 30, the first grooves 7 are formed rectangular, which feature corresponds to the structure of the semiconductor device 650 (FIG. 27).

In the semiconductor devices 700, 710 and 720, the second grooves 13 are formed in addition to the first grooves 7. The second grooves 13 which are at the same potential as the emitter electrode 11 (not shown) prevent holes implanted from the P+ collector layer 6 (not shown) from moving into the P base layer 2, whereby carriers accumulate under the P base layer 2 as well. This makes it possible to reduce the ON-voltage of the IGBTs. Further, as the area size of the P base layer 2 functioning as the anodes of the diodes is reduced, it is possible to reduce a recovery current at the diodes.

Embodiment 6

Figure 31:
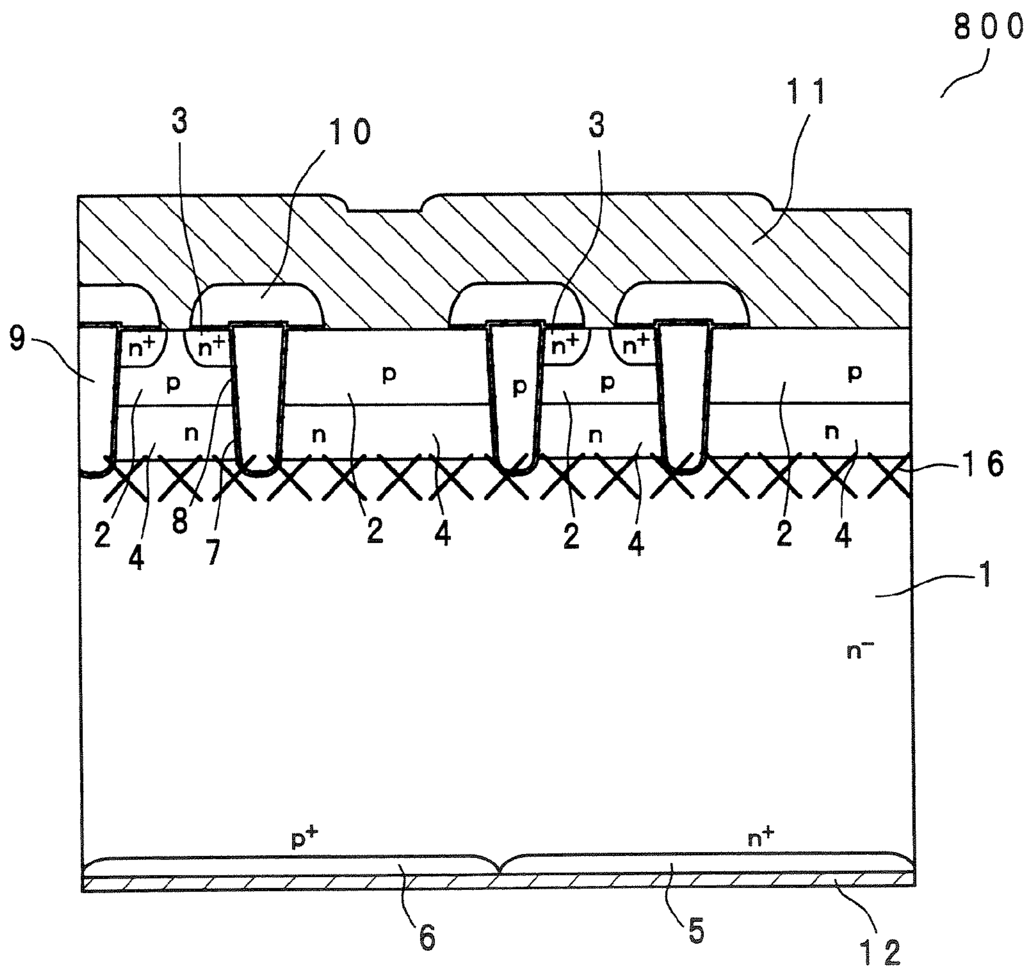
FIG. 31 is a cross sectional view of a semiconductor device according to an embodiment 6 of the present invention.

FIG. 31 is a cross sectional view of a semiconductor device generally denoted at 800 according to the embodiment 6. In FIG. 31, the same numerals as those used in FIG. 1 are the same or corresponding portions.

In the semiconductor device 800, helium ions for instance are implanted from the front surface, thereby forming a low-lifetime area (lifetime killer) 16 near the boundary between the N layer 4 and N− layer 4. The structure is otherwise similar to that of the semiconductor device 100.

In the semiconductor device 800, since the low-lifetime area 16 is formed near the boundary between the N layer 4 and N− layer 4, it is possible to reduce a carrier density right under the P base layer 2. Hence, during the diode operation, the density of carriers in the vicinity of the P base layer 2 functioning as the anodes decreases. It is therefore possible to reduce a recovery current during a recovery operation in which the diodes change from the ON-state to the OFF-state. In the semiconductor device 800 in particular, since the influence over the diodes is reduced at the time of turning on of the gates, despite the low-lifetime area 16 formed near the boundary between the N layer 4 and N− layer 1, it is possible to suppress a VF increase at the diodes.

Figure 32:
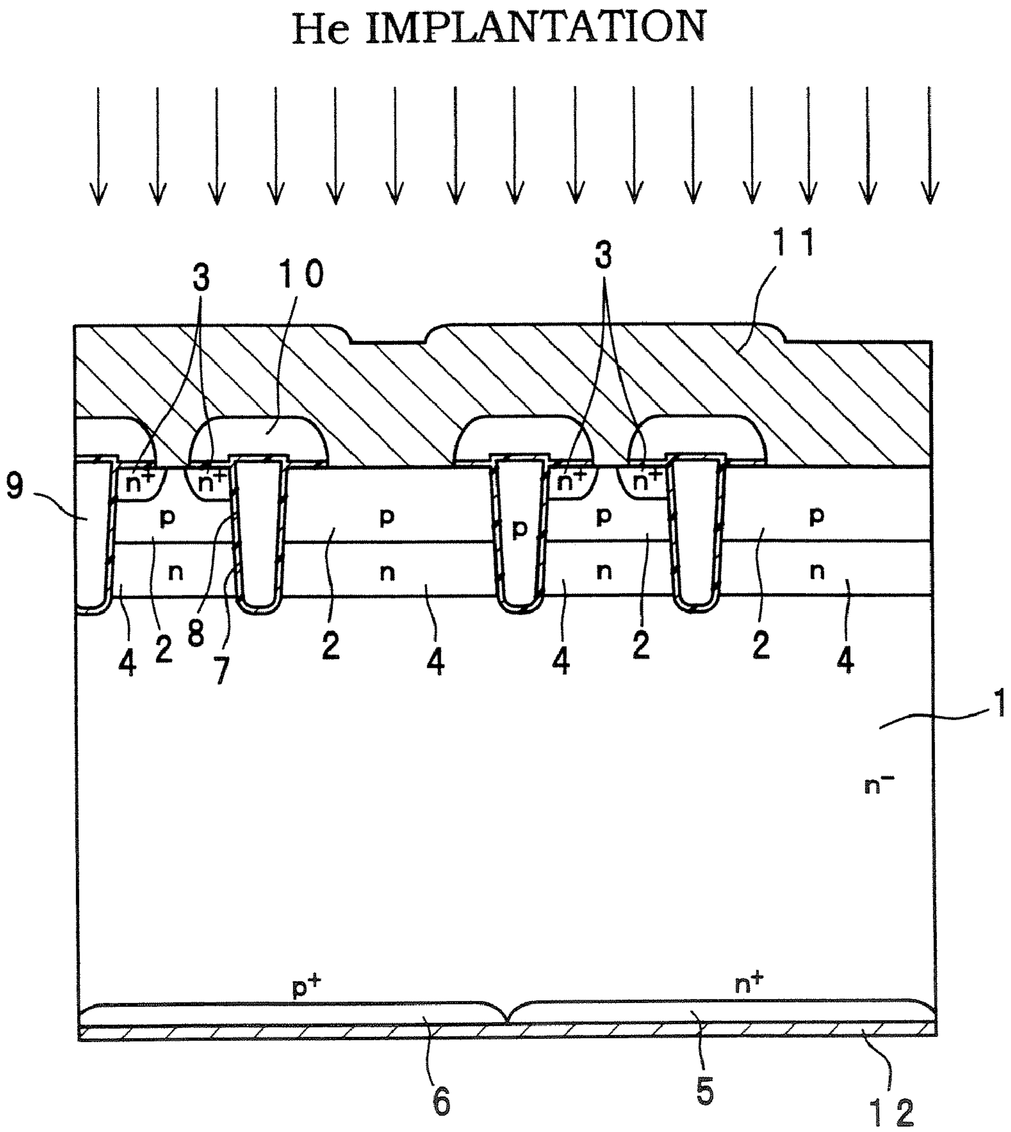
FIG. 32 is a cross sectional view of a step of manufacturing the semiconductor device according to the embodiment 6 of the present invention.
Figure 33:
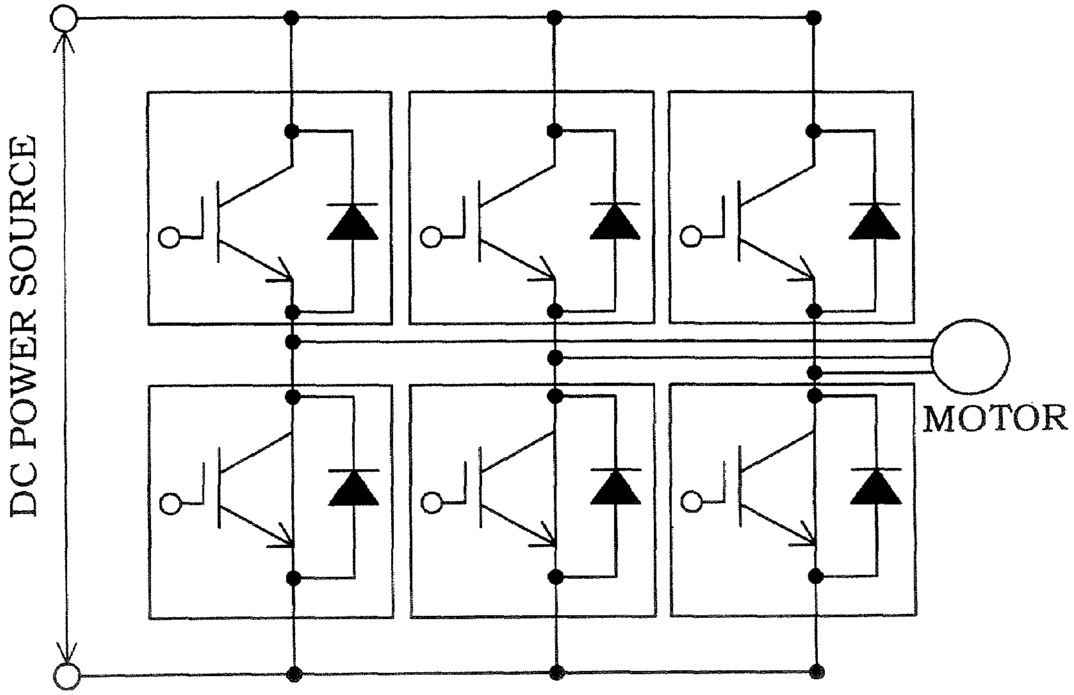
FIG. 33 is a circuitry diagram of an inverter which uses an insulating gate bipolar transistor and a free wheel diode.

The low-lifetime area 16 can be formed by implantation of helium ions from the front surface (FIG. 32) and annealing after the manufacturing step (10) according to the embodiment 1.

Although the IGBTs are N-channel transistors in the embodiments 1 through 6, the present invention is applicable also to P-channel IGBTs.

What is claimed is:

1. A method of manufacturing a semiconductor device having a transistor controlling a current flowing in a base layer by a gate electrode and a diode, comprising the steps of:

preparing a semiconductor substrate of a first conductivity type having first and second major surfaces;

forming a first conductivity type semiconductor layer on the first major surface of the semiconductor substrate;

forming a base layer of a second conductivity type on the surface of the semiconductor layer;

forming a pair of groove portions penetrating the base layer from the first major surface and reaching at least the semiconductor layer;

disposing an insulation film inside the groove portion and forming a gate electrode inside the groove portion through the insulation film forming an inter-layer insulation film to cover the top of the groove portion;

forming a first conductivity type semiconductor layer and a second conductivity type semiconductor layer on the second major surface of the semiconductor substrate; and disposing an emitter region along the groove portions only in a section of the base layer on the first major surface and located between the pair of groove portions.

2. The manufacturing method according to claim 1, comprising a step of forming at least two groove sets each formed by the pair of groove portions and further forming a second groove portion between the groove sets which are adjacent to each other.

3. A semiconductor device, comprising:

a semiconductor substrate of a first conductivity type having a first and second major surfaces;

a first conductivity type semiconductor layer formed on the first major surface of the semiconductor substrate;

a base layer of a second conductivity type formed on the first major surface of the semiconductor layer and separated by the semiconductor layer from the semiconductor substrate;

a pair of groove portions penetrating the base layer from the first major surface and reaching at least the semiconductor layer;

an insulation film disposed inside the groove portion and a gate electrode formed inside the groove portion through the insulation film an inter-layer insulation film formed to cover the top of the groove portion;

a first conductivity type semiconductor layer and a second conductivity type semiconductor layer formed on the second major surface of the semiconductor substrate; and an emitter region disposed on the first major surface of the base layer and along the groove portions, wherein a transistor controlling a current flowing in the base layer by the gate electrode and a diode made of the semiconductor layer and the base layer are disposed within the semiconductor device, and the emitter region is disposed only in an area which is between the pair of groove portions.

4. The semiconductor device according to claim 3, wherein there are at least two groove sets each formed by the pair of groove portions, and the gap between the pair of groove portions is narrower than the gap between the groove sets.

5. The semiconductor device according to claim 3, wherein there are at least two groove sets each formed by the pair of groove portions, and a second groove portion seating a conductive layer through the insulation film is provided between the groove sets which are adjacent to each other.

6. The semiconductor device according to claim 5, wherein the gap between the pair of groove portions is approximately equal to the gaps between the groove portion and the second groove portion.

7. The semiconductor device according to claim 5, wherein there are plurality of the second groove portions provided between the groove sets which are adjacent to each other.

8. The semiconductor device according to claim 7, wherein the gap between the second groove portions which are adjacent to each other is narrower than the gap between the pair of groove portions.

9. The semiconductor device according to claim 5, wherein the second groove portion is provided in the form of a lattice.

10. The semiconductor device according to claim 5, wherein the depth of the groove portion and the depth of the second groove portion are approximately the same.

11. The semiconductor device according to claim 5, wherein an emitter electrode is disposed on the first major surface of the semiconductor substrate, and the conductive layer inside the second groove portion is electrically connected with the emitter electrode.

12. The semiconductor device according to claim 3, wherein the plurality of the groove portions are shaped like stripes which are approximately parallel to each other, and the emitter region appears every other areas which are located between the groove portions.

13. The semiconductor device according to claim 3, wherein the groove portions are surrounded by the base layer which do not include the emitter region.

14. The semiconductor device according to claim 3, wherein the semiconductor layer comprises a low-lifetime area.

* * * * *